(12) United States Patent
Hayashi et al.

(10) Patent No.: US 10,720,412 B2
(45) Date of Patent: Jul. 21, 2020

(54) LIGHT EMITTING DEVICE

(71) Applicant: NICHIA CORPORATION, Anan-shi (JP)

(72) Inventors: Masaki Hayashi, Anan (JP); Yuki Shiota, Tokushima (JP); Junya Narita, Yoshinogawa (JP); Keisuke Kurashita, Anan (JP); Takanori Akaishi, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/042,151

(22) Filed: Feb. 12, 2016

(65) Prior Publication Data

US 2016/0240518 A1 Aug. 18, 2016

(30) Foreign Application Priority Data

Feb. 13, 2015 (JP) .................................. 2015-026146

(51) Int. Cl.
*H01L 33/00* (2010.01)
*H01L 25/075* (2006.01)
(Continued)

(52) U.S. Cl.
CPC ........ *H01L 25/0753* (2013.01); *H01L 25/167* (2013.01); *H01L 33/18* (2013.01);
(Continued)

(58) Field of Classification Search
CPC ... H01L 25/0753; H01L 33/486; H01L 33/56; H01L 33/62
(Continued)

(56) References Cited

U.S. PATENT DOCUMENTS 3,711,789 A * 1/1973 Dierschke ............. H01S 3/0933
257/88
4,536,778 A * 8/1985 De Schamphelaere ...................
B41J 2/451
257/E25.02
(Continued)

FOREIGN PATENT DOCUMENTS

JP 7-015044 1/1995
JP 9-167861 6/1997
(Continued)

OTHER PUBLICATIONS

Wang et al., "In Situ Fabrication of Bendable Microscale Hexagonal Pyramids Array Vertical Light Emitting Diodes with Graphene as Stretchable Electrical Interconnects", ACS Photonics (2014) pp. 421-429.*
(Continued)

*Primary Examiner* — Jay C Kim
(74) *Attorney, Agent, or Firm* — Mori & Ward, LLP

(57) ABSTRACT

Each of a plurality of light emitting elements has a polygonal shape with five or more corners. An interior angle at each of the corners is less than 180°. The plurality of light emitting elements include a first light emitting element having a first bottom surface, a first top surface opposite to the first bottom surface, and a first lateral side surface between the first bottom surface and the first top surface. The second light emitting element has a second bottom surface, a second top surface opposite to the second bottom surface, and a second lateral side surface between the second bottom surface and the second top surface. The second lateral side surface is provided not to oppose to the first lateral side surface in substantially parallel.

11 Claims, 19 Drawing Sheets

(51) Int. Cl.
*H01L 33/48* (2010.01)
*H01L 25/16* (2006.01)
*H01L 33/18* (2010.01)
*H01L 33/20* (2010.01)

(52) U.S. Cl.
CPC ............ *H01L 33/20* (2013.01); *H01L 33/486* (2013.01); *H01L 2224/32245* (2013.01); *H01L 2224/48091* (2013.01); *H01L 2224/48137* (2013.01); *H01L 2224/48247* (2013.01); *H01L 2224/73265* (2013.01); *H01L 2924/10156* (2013.01)

(58) Field of Classification Search
USPC ........................................................ 257/88
See application file for complete search history.

(56) References Cited

U.S. PATENT DOCUMENTS

| | | | | |
|---|---|---|---|---|
| 4,984,035 | A * | 1/1991 | Kanzawa | B41J 2/45 257/627 |
| 5,563,422 | A * | 10/1996 | Nakamura | H01L 21/28575 257/103 |
| 5,782,555 | A * | 7/1998 | Hochstein | B60Q 1/2696 362/373 |
| 5,936,599 | A * | 8/1999 | Reymond | G09G 3/32 345/46 |
| 6,307,218 | B1 * | 10/2001 | Steigerwald | H01L 33/38 257/94 |
| 6,486,499 | B1 * | 11/2002 | Krames | H01L 33/025 257/103 |
| 6,573,537 | B1 * | 6/2003 | Steigerwald | H01L 25/0753 257/103 |
| 6,642,548 | B1 * | 11/2003 | Brown | H01L 33/38 257/91 |
| 6,700,136 | B2 * | 3/2004 | Guida | H01L 25/0753 257/432 |
| 6,784,460 | B2 * | 8/2004 | Ng | H01L 33/20 257/100 |
| 6,828,170 | B2 * | 12/2004 | Roberts | H01L 23/49562 257/E23.044 |
| 6,864,570 | B2 * | 3/2005 | Smith | G02F 1/1362 257/701 |
| 6,871,982 | B2 * | 3/2005 | Holman | G02B 5/045 257/E33.072 |
| 6,891,200 | B2 * | 5/2005 | Nagai | F21K 9/90 257/88 |
| D511,328 | S * | 11/2005 | Wang | D13/180 |
| 7,002,182 | B2 * | 2/2006 | Okuyama | H01L 33/24 257/91 |
| 7,030,423 | B2 * | 4/2006 | Chang | H01L 33/486 257/100 |
| 7,176,502 | B2 * | 2/2007 | Mazzochette | H01L 25/0753 257/100 |
| 7,199,769 | B2 * | 4/2007 | Hyuga | G06K 15/129 345/77 |
| 7,205,168 | B2 * | 4/2007 | Oohata | H01L 33/007 257/E21.001 |
| 7,335,926 | B2 * | 2/2008 | Wang | H01L 25/0753 257/99 |
| 7,420,221 | B2 * | 9/2008 | Nagai | H01L 33/505 257/100 |
| 7,442,966 | B2 * | 10/2008 | Bader | H01L 33/46 257/103 |
| 7,445,354 | B2 * | 11/2008 | Aoki | H01L 33/486 257/100 |
| 7,498,184 | B2 | 3/2009 | Yakushiji et al. | |
| 7,511,311 | B2 * | 3/2009 | Kususe | H01L 24/06 257/94 |
| 7,525,126 | B2 * | 4/2009 | Leatherdale | G02B 27/0972 257/100 |
| 7,531,843 | B2 * | 5/2009 | Lin | H01L 25/0753 257/706 |
| 7,646,035 | B2 * | 1/2010 | Loh | B29C 45/1671 257/100 |
| 7,659,545 | B2 * | 2/2010 | Ansems | H01L 25/0753 257/88 |
| 7,663,307 | B2 * | 2/2010 | Kaneko | H01L 33/20 257/103 |
| 7,675,086 | B2 * | 3/2010 | Ku | H01L 33/486 257/100 |
| 7,690,813 | B2 * | 4/2010 | Kanamori | F21K 9/60 361/704 |
| 7,722,220 | B2 * | 5/2010 | Van De Ven | F21V 29/2212 362/294 |
| 7,736,945 | B2 * | 6/2010 | Schiaffino | H01L 33/0079 257/E21.503 |
| 7,768,025 | B2 * | 8/2010 | Jang | H01L 33/0079 257/79 |
| 7,821,020 | B2 * | 10/2010 | Park | H01L 33/58 257/100 |
| 7,829,358 | B2 * | 11/2010 | Duong | H01L 33/08 257/E21.05 |
| 7,845,828 | B2 * | 12/2010 | Ku | F21V 29/70 362/249.02 |
| 7,858,993 | B2 * | 12/2010 | Kong | H01L 33/486 257/81 |
| 7,868,332 | B2 * | 1/2011 | Rho | H01L 25/0753 257/100 |
| 7,884,543 | B2 * | 2/2011 | Doi | H01L 33/62 257/98 |
| 7,893,444 | B2 * | 2/2011 | Hsu | F21K 9/00 257/79 |
| 7,897,980 | B2 * | 3/2011 | Yuan | F21K 9/00 257/79 |
| 7,906,788 | B2 * | 3/2011 | Nagai | H01L 25/0753 257/88 |
| 7,915,623 | B2 * | 3/2011 | Yamamoto | B41J 2/45 257/79 |
| 7,944,708 | B2 * | 5/2011 | Lin | F21S 2/005 361/769 |
| 7,946,727 | B2 * | 5/2011 | Lee | F21S 2/005 362/249.06 |
| 7,948,770 | B2 * | 5/2011 | Lin | H05B 33/0803 361/760 |
| 7,985,979 | B2 * | 7/2011 | David | H01L 33/20 257/98 |
| 7,994,527 | B2 * | 8/2011 | DenBaars | H01L 33/58 257/95 |
| 8,058,669 | B2 * | 11/2011 | Chen | H01L 25/0753 257/59 |
| 8,076,680 | B2 * | 12/2011 | Lee | F21K 9/00 257/100 |
| 8,089,078 | B2 * | 1/2012 | Murofushi | H01L 27/15 257/88 |
| 8,129,743 | B2 * | 3/2012 | Suehiro | H01L 33/486 257/100 |
| 8,178,896 | B2 * | 5/2012 | Shimamura | C09K 11/025 257/103 |
| 8,309,985 | B2 * | 11/2012 | Shimamura | H01L 33/18 257/103 |
| 8,314,479 | B2 * | 11/2012 | Wai | H01L 24/97 257/676 |
| 8,318,518 | B2 * | 11/2012 | Hoshino | H01L 33/20 257/98 |
| 8,338,849 | B2 * | 12/2012 | Tischler | H01L 27/156 257/98 |
| 8,390,021 | B2 * | 3/2013 | Nagai | H01L 27/156 257/99 |
| 8,394,675 | B2 * | 3/2013 | Wai | H01L 24/97 257/433 |
| 8,399,876 | B2 * | 3/2013 | Kim | H01L 33/08 257/13 |
| 8,399,895 | B2 * | 3/2013 | Shakuda | H01L 33/08 257/93 |
| 8,492,776 | B2 * | 7/2013 | Nagai | H01L 25/0753 257/88 |
| 8,552,460 | B2 * | 10/2013 | Murphy | H01L 23/60 257/95 |

(56) References Cited

U.S. PATENT DOCUMENTS

| | | | | |
|---|---|---|---|---|
| 8,552,633 B2* | 10/2013 | Hong | ............... | H01L 27/3218 313/498 |
| 8,610,136 B2* | 12/2013 | Zoorob | ............... | H01L 25/0753 257/88 |
| 8,652,357 B2* | 2/2014 | Ryu | ............... | C09K 11/0883 252/301.4 F |
| 8,685,005 B2* | 4/2014 | Dahm | ............... | A61N 5/062 128/898 |
| 8,686,454 B2* | 4/2014 | Choi | ............... | H01L 33/08 257/435 |
| 8,698,976 B2* | 4/2014 | Hamada | ............... | G02B 6/0068 313/1 |
| 8,716,049 B2* | 5/2014 | Su | ............... | H01L 21/0242 257/615 |
| 8,716,723 B2* | 5/2014 | Chen | ............... | H01L 33/08 257/88 |
| 8,752,980 B2* | 6/2014 | Wu | ............... | F21K 9/20 257/E33.056 |
| 8,780,148 B2* | 7/2014 | Ohno | ............... | B41J 2/45 347/130 |
| 8,847,199 B2* | 9/2014 | Cha | ............... | B82Y 20/00 257/13 |
| 8,852,467 B2* | 10/2014 | Lowenthal | ............... | H01L 25/048 252/582 |
| 8,878,214 B2* | 11/2014 | Ubahara | ............... | H01L 27/156 257/88 |
| 8,884,318 B2* | 11/2014 | Lee | ............... | H01L 27/156 257/88 |
| 8,895,958 B2* | 11/2014 | Fukui | ............... | H01L 21/02488 257/12 |
| 8,897,631 B2* | 11/2014 | Kasai | ............... | H01L 21/67115 362/249.06 |
| 8,916,888 B2* | 12/2014 | Chen | ............... | H01L 33/20 257/88 |
| 8,926,145 B2* | 1/2015 | Lynch | ............... | F21S 8/02 257/98 |
| 8,928,009 B2* | 1/2015 | Okuyama | ............... | H01L 33/62 257/72 |
| 8,969,890 B2* | 3/2015 | Balkenende | ............... | H01L 21/0237 257/89 |
| 9,093,615 B2* | 7/2015 | Kim | ............... | H01L 33/486 |
| 9,099,573 B2* | 8/2015 | Seo | ............... | H01L 33/20 |
| 9,142,712 B2* | 9/2015 | Tamemoto | ............... | H01L 33/007 |
| 9,159,882 B2* | 10/2015 | Hwang | ............... | H01L 33/46 |
| 9,184,343 B2* | 11/2015 | Yoo | ............... | H01L 33/04 |
| 9,190,563 B2* | 11/2015 | Hwang | ............... | H01L 33/44 |
| 9,257,395 B2* | 2/2016 | Hatada | ............... | H01L 23/552 |
| 9,263,636 B2* | 2/2016 | Tarsa | ............... | H01L 33/20 |
| 9,269,745 B2* | 2/2016 | Kim | ............... | H01L 33/22 |
| 9,287,468 B2* | 3/2016 | Herner | ............... | H01L 27/156 |
| 9,305,906 B2* | 4/2016 | Choi | ............... | H01L 33/20 |
| 9,307,596 B2* | 4/2016 | Kang, II | ............... | H05B 45/48 |
| 9,318,529 B2* | 4/2016 | Jang | ............... | H01L 27/153 |
| 9,324,924 B2* | 4/2016 | Van De Ven | ............... | H01L 33/505 |
| 9,337,241 B2* | 5/2016 | Lee | ............... | H01L 27/3218 |
| 9,343,443 B2* | 5/2016 | Tischler | ............... | H01L 25/165 |
| 9,343,633 B1* | 5/2016 | Chang | ............... | H01L 25/0753 |
| 9,366,422 B2* | 6/2016 | McClure | ............... | B23P 15/26 |
| 9,385,342 B2* | 7/2016 | Rohatgi | ............... | H01L 51/5268 |
| D764,421 S * | 8/2016 | Kao | ............... | D13/180 |
| 9,472,735 B2* | 10/2016 | Ichikawa | ............... | H01L 33/505 |
| 9,478,705 B2* | 10/2016 | Balkenende | ............... | H01L 21/0237 |
| D770,988 S * | 11/2016 | Kim | ............... | D13/180 |
| 9,484,500 B2* | 11/2016 | Kim | ............... | H01L 33/42 |
| 9,520,536 B2* | 12/2016 | Kim | ............... | H01L 33/20 |
| 9,583,678 B2* | 2/2017 | Cich | ............... | H01L 33/32 |
| 9,594,207 B2* | 3/2017 | Kim | ............... | G02B 6/0023 |
| 9,618,190 B2* | 4/2017 | Motoki | ............... | F21K 9/232 |
| 9,627,596 B2* | 4/2017 | Hong | ............... | H01L 33/08 |
| 9,653,515 B2* | 5/2017 | Yoon | ............... | H01L 27/15 |
| 9,680,050 B2* | 6/2017 | Choi | ............... | H01L 33/08 |
| 9,704,926 B2* | 7/2017 | Kim | ............... | H01L 27/3218 |
| 9,748,437 B2* | 8/2017 | Ohlsson | ............... | H01L 33/0062 |
| 9,761,764 B2* | 9/2017 | Hayashi | ............... | H01L 33/20 |
| 9,825,011 B2* | 11/2017 | Marutani | ............... | H01L 25/0753 |
| 9,859,467 B2* | 1/2018 | Chen | ............... | H01L 33/38 |
| 9,863,616 B2* | 1/2018 | Gershowitz | ............... | F21V 21/00 |
| 9,953,550 B2* | 4/2018 | Greczanik | ............... | G06F 3/044 |
| 2002/0063258 A1* | 5/2002 | Motoki | ............... | H01L 33/16 257/95 |
| 2006/0163602 A1 | 7/2006 | Isokawa | | |
| 2008/0123344 A1 | 5/2008 | Shiraishi et al. | | |
| 2008/0170396 A1* | 7/2008 | Yuan | ............... | F21K 9/00 362/244 |
| 2008/0211416 A1* | 9/2008 | Negley | ............... | H01L 27/15 315/193 |
| 2013/0126900 A1 | 5/2013 | Inoue et al. | | |
| 2013/0285081 A1 | 10/2013 | Kuhn et al. | | |
| 2014/0034974 A1* | 2/2014 | Li | ............... | H01L 33/08 257/88 |
| 2014/0048827 A1 | 2/2014 | Inoue et al. | | |
| 2014/0056003 A1* | 2/2014 | Frattalone | ............... | F21K 9/20 362/249.06 |
| 2015/0115293 A1* | 4/2015 | Wu | ............... | H01L 27/156 257/88 |
| 2015/0155435 A1* | 6/2015 | Nei | ............... | H01L 33/62 257/98 |
| 2015/0214451 A1 | 7/2015 | Abe et al. | | |

FOREIGN PATENT DOCUMENTS

| | | | | |
|---|---|---|---|---|
| JP | 10-022529 | 1/1998 | | |
| JP | 2005-005433 | 1/2005 | | |
| JP | 2005-158958 | 6/2005 | | |
| JP | 2006-135309 | 5/2006 | | |
| JP | 2008-016565 | 1/2008 | | |
| JP | 2008-524831 | 7/2008 | | |
| JP | 2009-267423 | 11/2009 | | |
| JP | 2009-302314 | 12/2009 | | |
| JP | 2011-109143 | 6/2011 | | |
| JP | 2012-028452 | 2/2012 | | |
| JP | 2013-110179 | 6/2013 | | |
| JP | 2014-057050 | 3/2014 | | |
| WO | WO 2010/002226 A2 * | 1/2010 | ............ | H01L 33/00 |
| WO | WO 2012/020559 | 2/2012 | | |
| WO | WO 2014/049973 | 4/2014 | | |

OTHER PUBLICATIONS

"Verticle extends Cu-base hexagonal LED chip range to UV", Semiconductor Today (2013).*

Robidas et al., "Improved light extraction efficiency of InGaN/GaN blue LED by patterning free surfaces", Photonics 2010: Tenth International Conference on Fiber Optics and Photonics, edited by Sunil K. Khijwania, Banshi D. Gupta, Bishnu P. Pal, Anurag Sharma, Proceedings of SPIE vol. 8173 (2010).*

Japanese Office Action for corresponding JP Application No. 2015-026146, dated Nov. 15, 2016.

* cited by examiner

LIGHT EMITTING DEVICE

CROSS-REFERENCE TO RELATED APPLICATIONS

The present application claims priority under 35 U. S. C. § 119 to Japanese Patent Application No. 2015-026146, filed Feb. 13, 2015. The contents of this application are incorporated herein by reference in their entirety.

BACKGROUND

1. Technical Field

The present disclosure relates to a light emitting device.

2. Description of the Related Art

Japanese Unexamined Patent Application Publication No. 2009-267423 and Japanese Unexamined Patent Application Publication No. 2011-109143 disclose a light emitting device in which a plurality of light emitting elements each being quadrangular in a plan view are disposed in rows and columns.

SUMMARY OF THE INVENTION

According to one aspect of the present invention, a light emitting device includes a package, and a plurality of light emitting elements. The package has an upper surface and a direction substantially perpendicular to the upper surface. The plurality of light emitting elements are disposed on the upper surface. Each of the plurality of light emitting elements has a polygonal shape with five or more corners viewed in the direction. An interior angle at each of the corners is less than 180°. The plurality of light emitting elements include a first light emitting element and a second light emitting element. The first light emitting element has a first bottom surface, a first top surface opposite to the first bottom surface in the direction, and a first lateral side surface between the first bottom surface and the first top surface. The first light emitting element is disposed on the upper surface of the package at the first bottom surface. The second light emitting element has a second bottom surface, a second top surface opposite to the second bottom surface in the direction, and a second lateral side surface between the second bottom surface and the second top surface. The second light emitting element is disposed on the upper surface of the package at the second bottom surface. The second lateral side surface is provided not to oppose to the first lateral side surface in substantially parallel.

According to another aspect of the present invention, a light emitting device includes a package and a plurality of light emitting elements. The package has a recess with a bottom surface and a direction substantially perpendicular to the bottom surface. The plurality of light emitting elements are disposed on the bottom surface. Each of the plurality of light emitting elements has a polygonal shape with five or more corners viewed in the direction. An interior angle at each of the corners is less than 180 degrees.

According to further aspect of the present invention, a light emitting device includes a package and a plurality of light emitting elements. The package has an upper surface and a direction substantially perpendicular to the upper surface. The plurality of light emitting elements are disposed on the upper surface. Each of the plurality of light emitting elements has a polygonal shape with five or more corners viewed in the direction. An interior angle at each of the corners is less than 180. The plurality of light emitting elements include a first light emitting element and a second light emitting element which are provided such that one corner of the first light emitting element is closest to the second light emitting element.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 9A is a schematic plan view showing the configuration of;

DESCRIPTION OF THE EMBODIMENTS

Figure 1A:
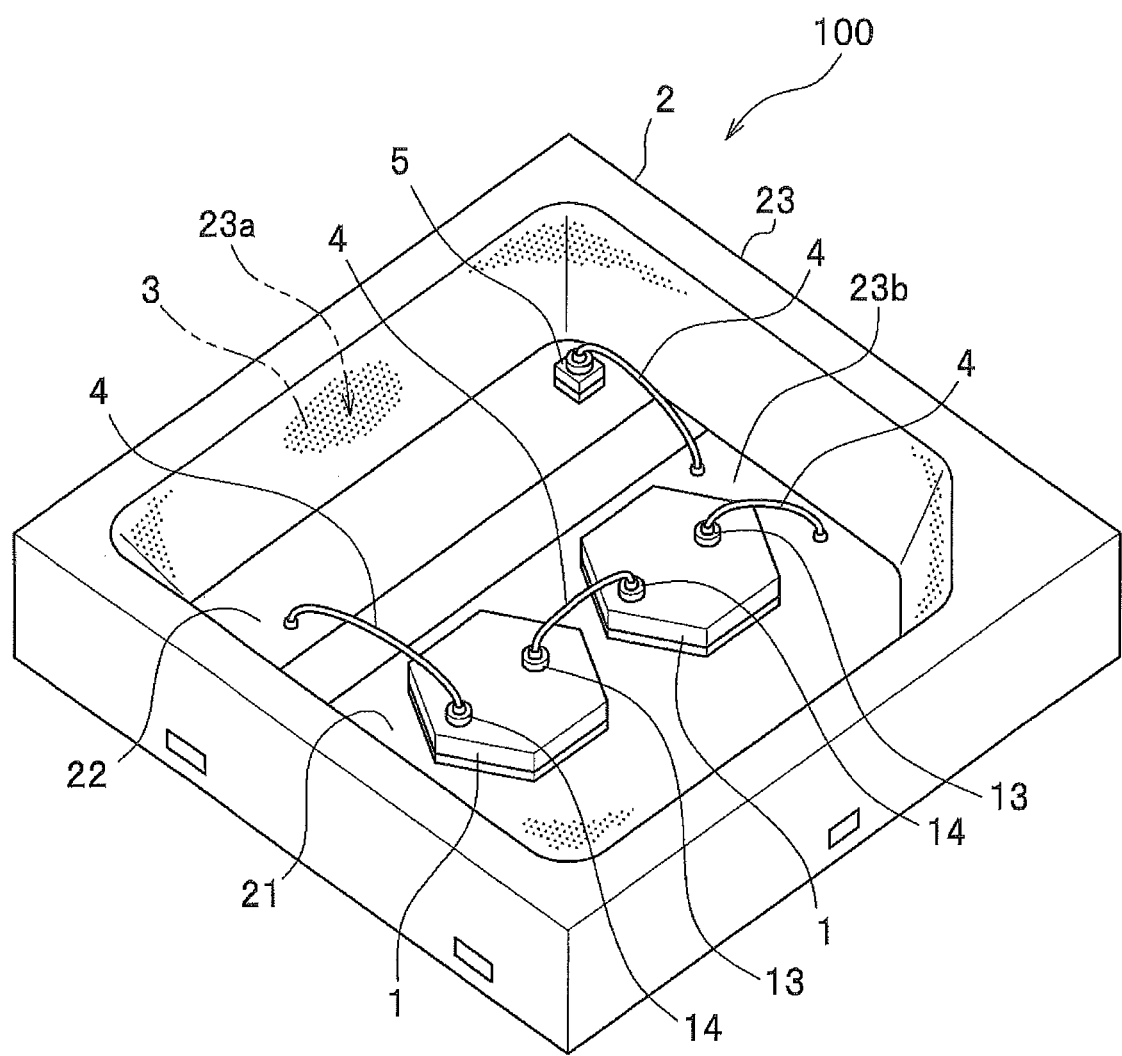
FIG. 1A is a schematic perspective view showing a configuration of a light emitting device according to a first embodiment.

The embodiments will now be described with reference to the accompanying drawings, wherein like reference numerals designate corresponding or identical elements throughout the various drawings.

In the following, a description will be given of a light emitting device and a method of manufacturing the light emitting device according to embodiments. Note that, since the drawings referred to in the following description schematically show the embodiments, the scale, intervals, or positional relationship of the constituent elements may be exaggerated, or part of the constituent elements may not be shown. Further, for example between a plan view and a corresponding cross-sectional view, the scale or intervals of the constituent elements may not be common. Still further, in the following description, identical names and reference characters denote identical or similar constituent elements on principle, and detailed description are omitted as appropriate.

Further, in connection with the light emitting device and the method of manufacturing the light emitting device according to the embodiments, "top/upper", "bottom/lower", "left", and "right" are to be replaced by one another according to the situation. In the present specification, "top/upper", "bottom/lower" and the like refer to the relative positions between the constituent elements in the drawings referred to for an explanation, and are not intended to specify absolute positions unless otherwise stated.

First Embodiment

Configuration of Light Emitting Device

Figure 1B:
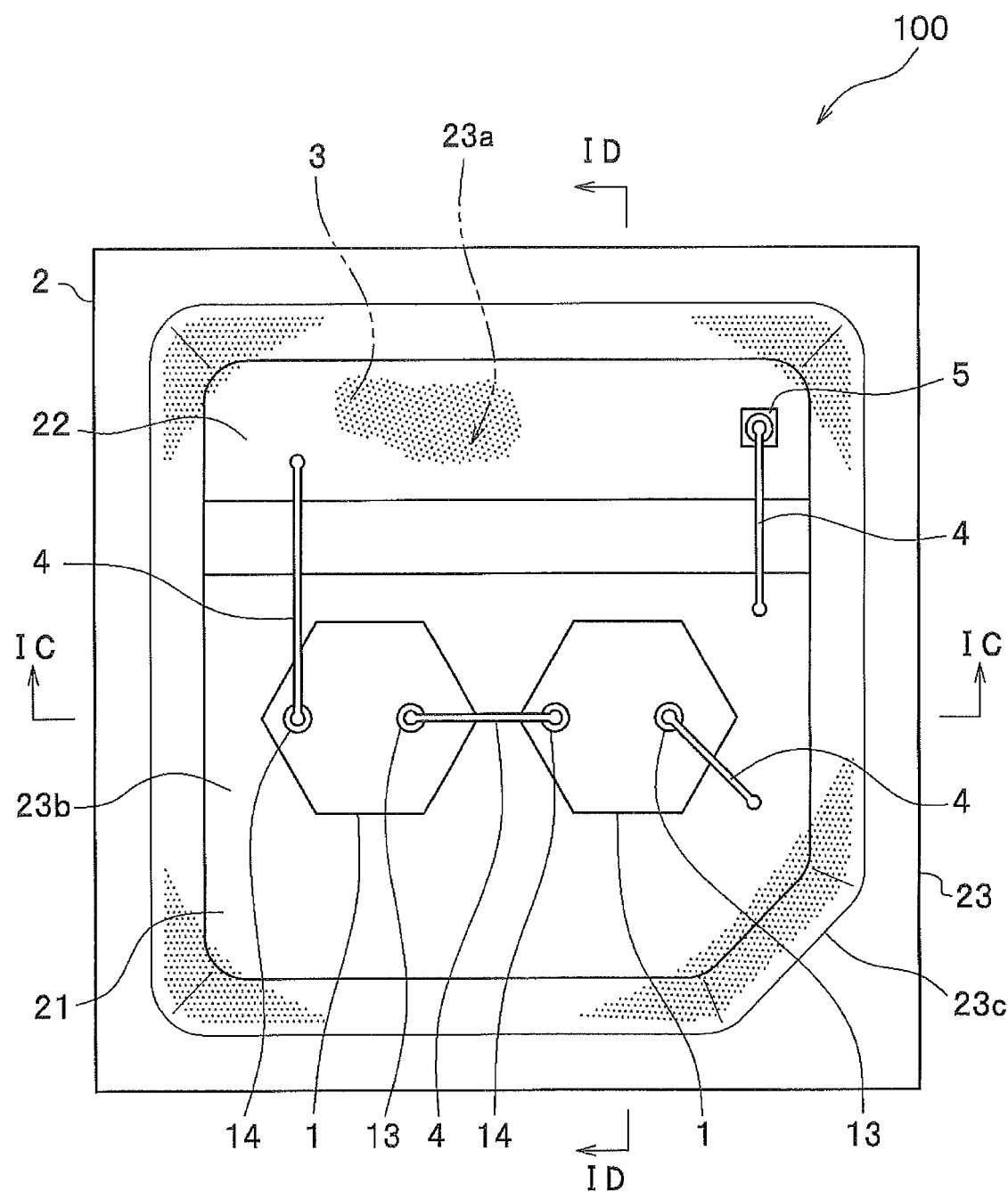
FIG. 1B is a schematic plan view showing the configuration of the light emitting device according to the first embodiment.
Figure 1C:
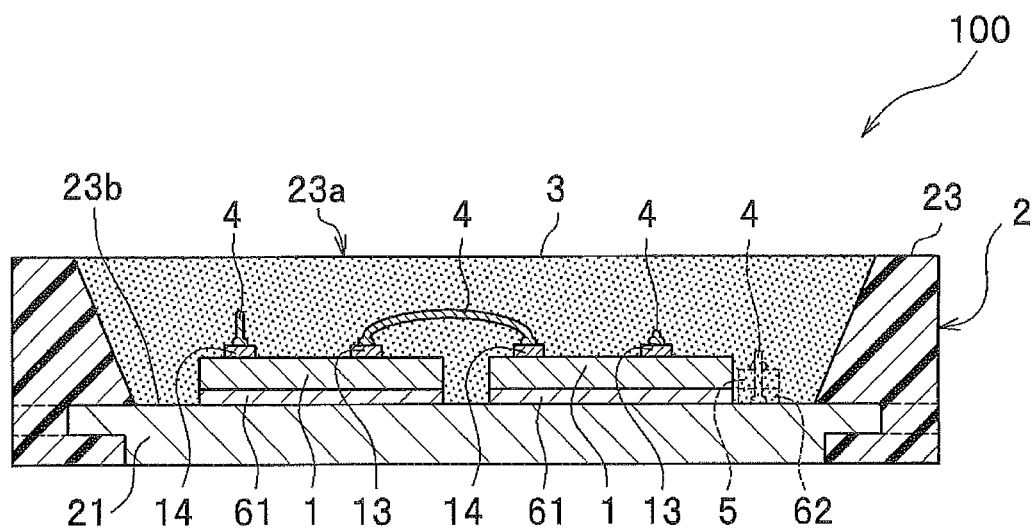
FIG. 1C is a schematic cross-sectional view showing the configuration of the light emitting device according to the first embodiment, taken along line IC-IC in FIG. 1B.
Figure 1D:
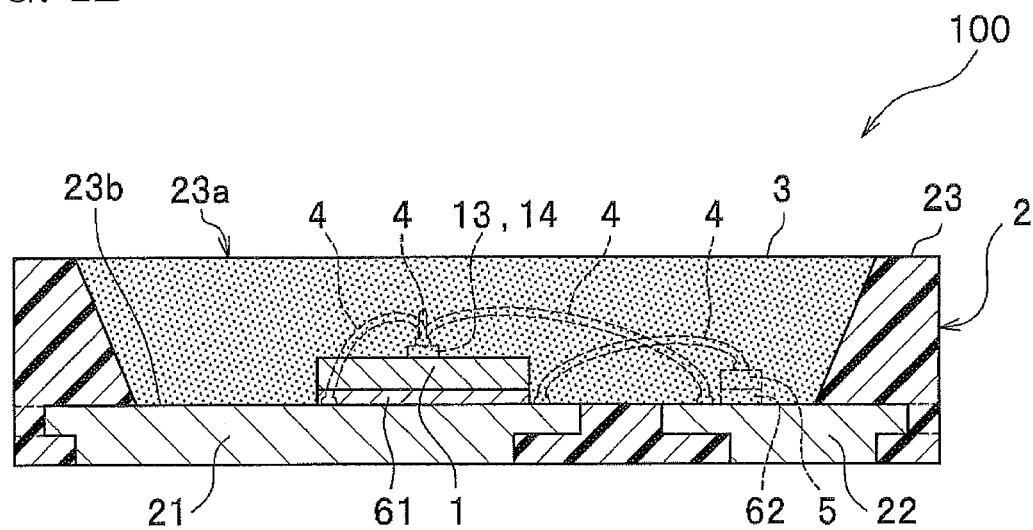
FIG. 1D is a schematic cross-sectional view showing the configuration of the light emitting device according to the first embodiment, taken along line ID-ID in FIG. 1B.

With reference to FIGS. 1A to 1D, a configuration of a light emitting device according to a first embodiment. FIG. 1A is a schematic perspective view showing the configuration of the light emitting device according to the first embodiment. FIG. 1B is a schematic plan view showing the configuration of the light emitting device according to the first embodiment. FIG. 1C is a schematic cross-sectional view showing the configuration of the light emitting device according to the first embodiment, being a cross-sectional view taken along line IC-IC in FIG. 1B. FIG. 1D is a schematic cross-sectional view showing the configuration of the light emitting device according to the first embodiment, being a cross-sectional view taken along line ID-ID in FIG. 1B.

A light emitting device 100 according to the first embodiment includes two light emitting elements 1 and a package 2, each of the light emitting elements 1 having a hexagonal shape in a plan view.

The light emitting elements 1 are arranged on a bottom surface of a recess 23a formed in an upper surface of the package 2, and the light emitting elements 1 are electrically connected to lead electrodes 21, 22 via wires 4, where the lead electrodes 21, 22 are disposed to form most portion of the bottom surface 23b of the recess 23a. The light emitting elements 1 are each bonded to the bottom surface 23b of the recess 23a using a die bonding resin 61. Further, a protective element 5 is provided in the recess 23a, and is electrically connected to the lead electrodes 21, 22 via an electrically conductive joining member 62 and the wire 4. Further, in the recess 23a, a light transmissive sealing resin 3 is provided, so as to seal the light emitting elements 1 and the protective element 5.

Further, light generated by each of the light emitting elements 1 is emitted upward from the opening of the recess 23a through the light transmissive sealing resin 3.

Note that, in FIGS. 1A and 1B, shading represents the existence of the sealing resin 3 in the recess 3a.

The light emitting elements 1 are bonded to the lead electrode 21 of one polarity provided at the bottom surface 23b of the recess 23a opening at the upper surface of the package 2 using the die bonding resin 61. Further, the positive and negative pad electrodes (the anode and the cathode) of each light emitting element 1 are electrically connected to the lead electrodes 21, 22 of corresponding polarity, via bonding wires 4 made of, for example, Au, Ag, Cu, or Al.

Further, in the example shown in the figures, two light emitting elements 1 are mounted, but three or more light emitting elements 1 can also be mounted. The plurality of light emitting elements may emit light of the same or different colors.

Figure 2A:
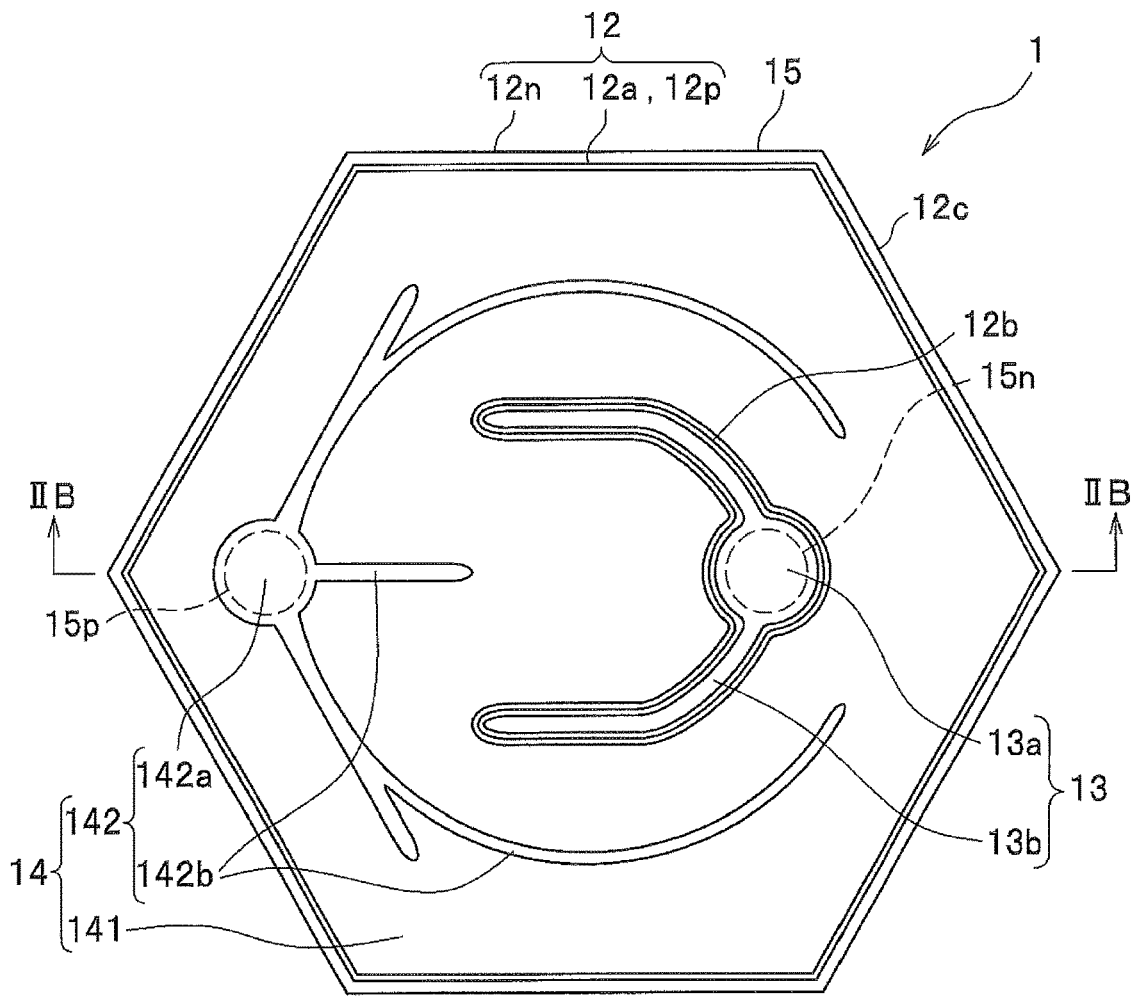
FIG. 2A is a schematic plan view showing the configuration of a light emitting element in the light emitting device according to the first embodiment.
Figure 2B:
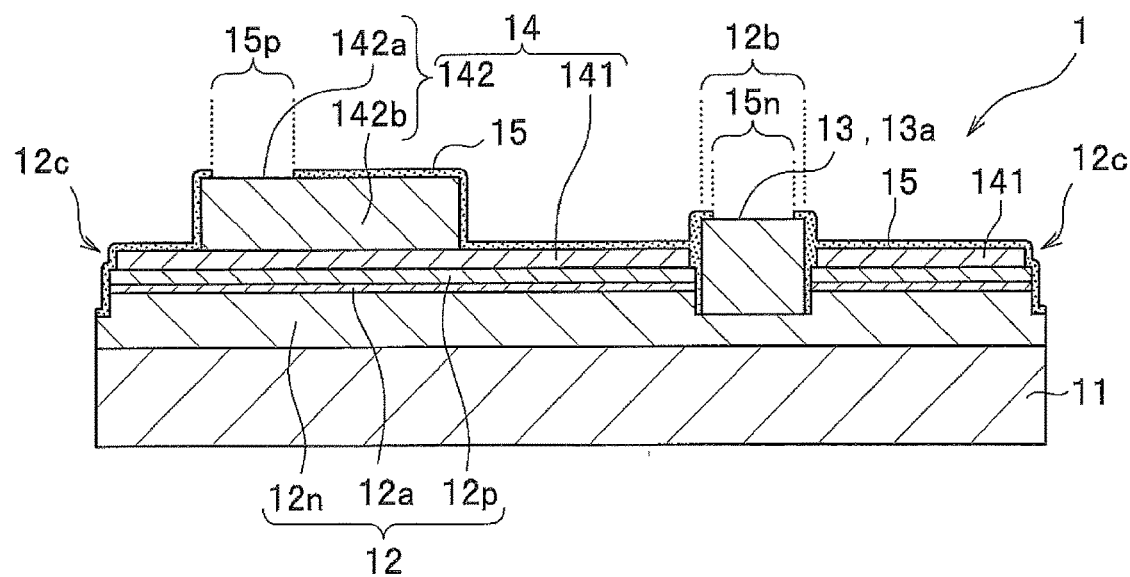
FIG. 2B is a schematic cross-sectional view showing the configuration of the light emitting element in the light emitting device according to the first embodiment, taken along line IIB-IIB in FIG. 2A.

Next, with reference to FIGS. 2A and 2B, a configuration of a single light emitting element 1 will be described. FIG. 2A is a schematic plan view showing a configuration of one light emitting element in the light emitting device according to the first embodiment. FIG. 2B is a schematic cross-sectional view showing the configuration of the light emitting element in the light emitting device according to the first embodiment, taken along line IIB-IIB in FIG. 2A.

Note that, in the present embodiment, since the light emitting device 100 is of the top-view type, the light emitting element 1 is mounted such that the main surface of a substrate 11 is in parallel to the upper surface of the light emitting device 100, that is, in parallel to the bottom surface 23b of the recess 23a.

As the light emitting element 1, a semiconductor light emitting element such as an LED can be suitably used. The light emitting element 1 according to the present embodiment is formed into an approximately regular hexagon in a plan view, and includes the substrate 11, a semiconductor stacked-layer body 12, an n-side electrode 13, a p-side electrode 14, and a protective film 15. In more detail, the light emitting element 1 according to the present embodiment includes, on one main surface of the substrate 11, the semiconductor stacked-layer body 12 having a light emitting diode "LED" configuration, and further, the n-side electrode 13 and the p-side electrode 14 are disposed on one surface side of the semiconductor stacked-layer body 12. Thus, the light emitting element 1 has the configuration suitable for face-up type mounting.

The outer shape of the light emitting element 1 in a plan view is an approximately regular hexagon. Accordingly, when a plurality of light emitting elements 1 are mounted, the light emitting elements 1 can be disposed such that, at least part of the plurality of light emitting elements are disposed so that mutually facing lateral sides of adjacent ones of the light emitting elements are not in parallel to each other.

Note that, the outer shape in a plan view of the light emitting element 1 is not limited to an approximately regular hexagon, and may be a convex polygon of at least five sides whose interior angles are all less than 180 degrees. Other exemplary outer shape in a plan view of the light emitting element 1 will be described later.

In the present specification, the expressions the lateral side surfaces of the light emitting elements 1 being "paral-lel" or "substantially parallel" to each other includes the case where the inclination angle from the parallel reference is 10° or smaller.

The substrate 11 is a substrate suitable for epitaxially growing the semiconductor stacked-layer body 12 thereon. The substrate 11 may be, for example, in the case of forming the semiconductor stacked-layer body 12 with a nitride semiconductor such as GaN (gallium nitride), an insulating substrate of a sapphire with a principal plane being C-plane, R-plane, or A-plane, and a spinel ($MgAl_2O_4$), or an oxide substrate such as lithium niobate or neodymium gallate that forms lattice bonds with silicon carbide (SiC), ZnS, ZnO, Si, GaAs, diamond, and a nitride semiconductor.

The semiconductor stacked-layer body 12 is made of an n-type semiconductor layer 12n and a p-type semiconductor layer 12p stacked on one main surface that is the upper surface of the substrate 11. The semiconductor stacked-layer body 12 is configured to emit light upon application of electric current between the n-side electrode 13 and the p-side electrode 14. The semiconductor stacked-layer body 12 preferably includes an active layer 12a between the n-type semiconductor layer 12n and the p-type semiconductor layer 12p.

In the semiconductor stacked-layer body 12, a region absent of the p-type semiconductor layer 12p and the active layer 12a, that is, a step portion 12b recessed from the surface of the p-type semiconductor layer 12p is formed. The bottom surface of the step portion 12b is formed by the n-type semiconductor layer 12n. In the present embodiment, in FIG. 2A, the step portion 12b is formed to extend generally semicircularly around the center portion of the light emitting element, from a portion near the right end of the light emitting element 1 in the figure.

The n-side electrode 13 is mounted on the bottom surface of the step portion 12b and electrically connected to the n-type semiconductor layer 12n.

Also, a step portion 12c absence of the p-type semiconductor layer 12p and the active layer 12a is also formed at an outer edge portion of the light emitting element 1. The step portion 12c is a part of a dicing street that is a cutting region used in singulating individual light emitting elements 1 from a wafer.

Further, a light transmissive electrode 141 is disposed on substantially the entire upper surface of the p-type semiconductor layer 12p as a lower layer of the p-side electrode 14, and a pad electrode 142 is disposed a portion of the upper surface of the light transmissive electrode 141 as an upper layer of the p-side electrode 14. In addition, the surfaces of the semiconductor stacked-layer body 12, the n-side electrode 13 and the p-side electrode 14 are covered by a protective film 15, except for an external connection portion 13a of the n-side electrode 13 and an external connection portion 142a of the pad electrode 142 of the p-side electrode 14.

Examples of suitable semiconductor stacked-layer body 12, include stacked-layers of semiconductors such as ZnS, SiC, GaN, GaP, InN, AlN, ZnSe, GaAsP, GaAlAs, InGaN, GaAlN, AlInGaP, and AlInGaN provided on a substrate, formed by using a liquid phase growing method, a HDVPE method, a MOCVD method, or the like. As to the semiconductor material, a gallium nitride-based semiconductor represented by $In_XAl_YGa_{1-X-Y}N$ ($0 \le X$, $0 \le Y$, $X+Y<1$) can be more suitably used, because any light emission wavelength ranging from ultraviolet light to infrared light can be selected by selecting a mixed crystal ratio.

The n-side electrode 13 is electrically connected to the n-type semiconductor layer 12n at the bottom surface of the step portion 12b of the semiconductor stacked-layer body 12. The n-side electrode 13 is a negative pole for supplying external current to the light emitting element 1. Further, in the plan view of FIG. 2A, the n-side electrode 13 has the external connection portion 13a at a portion near the right end of the light emitting element 1, and has an extending portion 13b extending from the external connection portion 13a toward the external connection portion 142a of the p-side pad electrode 142.

The n-side electrode 13 may be made of, for example, Cu, Au or an alloy containing Cu or Au as a main component, in order to be suitable for connecting to the outside by way of wire bonding or the like.

Further, a lower layer portion of the n-side electrode 13 may be made of a material having good reflectivity to the wavelength of light emitted from the semiconductor stacked layer body 12, for example, Al, Ru, Ag, Ti, Ni, or an alloy containing one of those as a main component. Thus, light emitted from the semiconductor stacked layer body 12 and propagating inside the semiconductor stacked layer body 12 and incident on the lower surface of the n-side electrode 13 can be reflected at the lower surface of the n-side electrode 13 so as to reduce absorption of light by the n-side electrode 13 and increase the light extracting efficiency to the outside.

The p-side electrode 14 is a positive electrode disposed electrically connected to the upper surface of the p-type semiconductor layer 12p to supply external current to the light emitting element 1. The p-side electrode 14 includes the light transmissive electrode 141 and the pad electrode 142 formed on the light transmissive electrode 141.

The light transmissive electrode 141 that is the lower layer of the p-side electrode 14 is disposed on substantially the entire upper surface of the p-type semiconductor layer 12p. The light transmissive electrode 141 functions as a current diffusion layer to diffuse current that is externally supplied via the pad electrode 142 to the entire p-type semiconductor layer 12p. Further, the light emitted by the semiconductor stacked-layer body 12 is extracted to the outside mainly via the light transmissive electrode 141. Therefore, the light transmissive electrode 141 preferably has a high light transmissive property to the wavelength of the light emitted by the semiconductor stacked-layer body 12.

The light transmissive electrode 141 is formed by an electrically conductive metal oxide. The electrically conductive metal oxide may be oxide containing at least one element selected from a group consisting of Zn (zinc), In (indium), Sn (tin), Ga (gallium) and Ti (titanium). Specifically, the electrically conductive metal oxide may be ZnO, Al-doped ZnO "AZO", In-doped ZnO "IZO", Ga-doped ZnO "GZO", $In_2O_3$, Sn-doped $In_2O_3$ "ITO", F-doped $In_2O_3$ "IFO", $SnO_2$, Sb-doped $SnO_2$ "ATO", F-doped $SnO_2$ "FTO", Cd-doped $SnO_2$ "CTO", or $TiO_2$.

Among others, ITO has high light transmissive property to visible light (in the visible region) and exhibits high electrical conductivity. Therefore, ITO is a material suitable for covering substantially the entire upper surface of the p-type semiconductor layer 12p.

The pad electrode 142, which is the upper layer, is a layer configured to connect to an external electrode, and disposed on a portion of the upper surface of the light transmissive electrode 141. Further, the pad electrode 142 includes the external connection portion 142a for connecting to the outside via a wire or the like, and an extending portion 142b extending from the external connection portion 142a. The extending portion 142b is provided toward the external connection portion 13a of the n-side electrode 13 and to surround the extending portion 13b so that the current can be diffused more efficiently.

Similarly to the n-side electrode 13, the pad electrode 142 may be made of, for example, Cu, Au or an alloy containing Cu or Au as a main component, in order to be suitable for connecting to the outside by way of wire bonding or the like.

Note that, in the present embodiment, the pad electrode 142 includes the external connection portion 142a and the extending portion 142b made of the same material.

Further, an insulating film may be disposed on the p-type semiconductor layer 12p in a region immediately below the region where the pad electrode 142 is disposed and its vicinity in a plan view. With the insulating film provided in this manner, the current flowing through the p-type semiconductor layer 12p immediately below the pad electrode 142 can be reduced, and the light emission at such region can be reduced. Accordingly, the amount of light propagating toward the pad electrode 142 can be reduced, so that the amount of light absorbed by the pad electrode 142 can be reduced, and as a result, the light emission amount of the semiconductor stacked-layer body 12 as a whole can be increased. The insulating film is preferably light transmissive and, for example, an oxide such as $SiO_2$, $TiO_2$, or $Al_2O_3$, a nitride such as SiN, or a fluoride such as MgF can be used suitably.

The protective film 15 is a light transmissive insulating film, disposed on approximately the entire upper surface and lateral side surfaces of the light emitting element 1 except for the lateral side surfaces and the lower surface of the substrate 11. Further, the protective film 15 has an opening 15n at the upper surface of the n-side electrode 13, and has an opening 15p at the upper surface of the pad electrode 142. The regions respectively exposed at the openings 15n, 15p serve as external connection portions 13a, 142a.

For the protective film 15, an oxide such as $SiO_2$, $TiO_2$, or $Al_2O_3$, a nitride such as SiN, or a fluoride such as MgF can be used suitably.

Note that, in the light emitting element 1, configurations such as the locations and, shapes, and the configurations of the layers and so forth of the n-side electrode 13 and the p-side electrode 14 and the like, and the locations and the shapes and so forth of the step portion 12b and the like are not limited to that exemplified in the present embodiment, and can be determined as appropriate.

Further, in FIGS. 1A to 1D, for the simplicity of explanation, only the positive and negative external connection portions 13a, 142a are shown as the n-side electrode 13 and the p-side electrode 14 of the light emitting element 1.

Referring back to FIGS. 1A to 1D, the description of the light emitting device 100 is continued.

The package 2 includes the lead electrodes 21, 22 and the resin part 23. The package 2 has an outer shape of approximately quadrangular prism shape flat in the thickness direction of the light emitting device 10, with an approximately square shape in a plan view. The package 2 defines a recess 23a that opens in the upper surface and the light emitting elements 1 are mounted in the recess 23a so that light is emitted from the opening of the recess, and thus the package 2 is suitable for top-view type mounting.

The lead electrode 21 and the lead electrode 22 are a pair of electrodes corresponding to positive and negative polarity. The lead electrodes 21, 22 are disposed so as to be supported by the resin part 23, and the upper surfaces of the lead electrodes 21, 22 configuration the bottom surface 23b of the recess 23a. To the upper surface of the lead electrode 21, two light emitting elements 1 are bonded by the die bonding resin 61. The two light emitting elements 1 are electrically connected in series between the lead electrodes 21, 22 by the wires 4. Further, to the upper surface of the lead electrode 22, the protective element 5 is bonded by the joining member 62, and electrically connected between the lead electrodes 21, 22 by the wire 4 and the electrically conductive joining member 62.

Further, the lower surfaces of the lead electrodes 21, 22 are the mounting surface of the light emitting device 100 for establishing external connection. Accordingly, the light emitting device 100 is mounted such that the bottom surface of the light emitting device is placed opposite to the mounting substrate and the lower surfaces of the lead electrodes 21, 22 are bonded to the wiring pattern of the mounting substrate by an electrically conductive joining member such as a solder.

The lead electrodes 21, 22 are each made of plate-like metal. The thickness of the lead electrodes 21, 22 may be uniform or partially thick or thin.

The material of the lead electrodes 21, 22 is not specifically limited, but a material having a relatively great thermal conductivity is preferably used. By employing such a material, the heat generated at the light emitting elements 1 can be efficiently released to the outside via the lead electrodes 21, 22. Preferable material of the lead electrodes 21, 22 has a thermal conductivity of, for example, about 200 W/(m·K) or greater, and relatively great mechanical strength or good processability in press working or etching. Alternatively, the material with which punching press work or etching work can be easily performed is preferable. Examples of such a materias include a metal such as copper, aluminum, gold, silver, tungsten, iron, and nickel, and an alloy such as iron-nickel alloy and phosphor bronze. Further, portions of the lead electrodes 21, 22 that are exposed as the bottom surface 23b of the recess 23a are preferably provided with a reflective-plating of Ag or the like having a high light reflectivity, for the purpose of efficiently extracting light from the light emitting elements 1 that are mounted thereon.

The resin part 23 is a base body of the package 2 for supporting the lead electrodes 21, 22. The resin part 23 defines the recess 23a in the upper surface. The bottom surface 23b of the recess 23a is mainly formed with the surfaces of the lead electrodes 21, 22 that provide a mounting surface. Further, on the lower surface side of the resin part 23, the lead electrodes 21, 22 are exposed, to function as the mounting surface.

On the lead electrodes 21, 22, which are the bottom surface 23b of the recess 23a, two light emitting elements 1 and one protective element 5 are respectively mounted. The lateral side surfaces defining the recess 23a are inclined such that the recess 23a is widened upward so that light emitted from the light emitting element in directions toward the lateral sides can be reflected upward, which is the light extracting direction.

Further, in a plan view, the recess 23a is formed with an opening of an approximately square with one rounded corner, which serves as a cathode mark 23c for distinguishing the polarity of the lead electrodes 21, 22.

The resin part 23 is made of a light transmissive resin having light reflectivity, which is obtained by containing particles of a light reflective material, so that the resin part 23 also serves as a light reflecting member. The resin part 23 also functions as a light reflective member in the recess 23a for reflecting the light from the light emitting elements 1 upward efficiently.

Further, the light transmissive sealing resin 3 is filled in the recess 23a.

The resin material used for the material of the resin part 23 preferably has good light transmissive property to the wavelength of light emitted by the light emitting elements 1, and a thermosetting resin, a thermoplastic resin or the like can be used. Exemplary thermosetting resin may be silicone resin, silicone-modified resin, silicone hybrid resin, epoxy resin, epoxy-modified resin, urea resin, diallyl phthalate resin, phenol resin, unsaturated polyester resin, or hybrid resin containing at least one of the foregoing resins. Exemplary thermoplastic resin may be polycarbonate resin, acrylic resin, polymethylpentene resin, polynorbornene resin, polyphthalamide resin, polyester resin, liquid crystal resin, polyphenylene ether resin, aromatic polyamide resin, or hybrid resin containing at least one of the foregoing resins. Among those, polyester resin such as polycyclohexylenedimethylene terephthalate "PCT", aromatic polyamide resin, epoxy resin, unsaturated polyester resin, silicone resin, and silicone hybrid resin exhibiting good heat-resistance and lightfastness are preferable.

The light reflective substance contained in the resin part 23 is preferably particles of a material having a large difference in index of refraction from the above-described resin material and has good light transmissive property.

Such a light reflective substance preferably has an index of refraction of 1.8 or more for example. In order to efficiently scatter light and to attain high light extraction efficiency, the index of refraction is preferably 2.0 or more and more preferably 2.5 or more. The difference in the refractive index with respect to that of the resin material is, for example, 0.4 or greater, and in order to efficiently scatter light and to attain high light extraction efficiency, the difference is preferably 0.7 or greater, and more preferably 0.9 or greater. Further, the average particle size of the particles of the light reflective substance is preferably in a range of 0.08 μm to 10 μm inclusive, and more preferably in a range of 0.1 μm to 5 μm inclusive, in order to efficiently scatter light and to attain high light extraction efficiency.

Note that, in the present specification, the values of average particle size of particles of the light reflective substance, the wavelength converting substance and the like are obtained by observation through use of an electron microscope. Particles are measured in a certain axis direction, and by number-based measurement (number-based distribution) in which the size of the particles is measured using an electron microscope (SEM, TEM).

Further, as the light reflective substance, specifically, particles of white pigment such as $TiO_2$ (titanium oxide), $ZrO_2$ (zirconium oxide), MgO (magnesium oxide), $MgCO_3$ (magnesium carbonate), $Mg(OH)_2$ (magnesium hydroxide), $CaCO_3$ (calcium carbonate), $Ca(OH)_2$ (calcium hydroxide), $CaSiO_3$ (calcium silicate), ZnO (zinc oxide), $BaTiO_3$ (barium titanate), and $Al_2O_3$ (aluminum oxide) can be used. Among those, $TiO_2$ is preferable, because $TiO_2$ is relatively stable to moisture or the like, and has a high index of refraction and good thermal conductivity.

Further, in order to obtain better reflectivity, when light emitted by the light emitting elements 1 is visible light, preferably $TiO_2$ is employed as the light reflective substance, and when the light is ultraviolet light, preferably $Al_2O_3$ is used as the light reflective substance.

Still further, the resin material contains the light reflective substance in a range with which full light reflectivity is obtained and with which moldability in forming the package is not impaired. For that, the content of the light reflective substance in the resin part 23 is preferably in a range of 10 mass % to 60 mass % inclusive. With the content value of 10 mass % or more, the reflectivity of the resin can be increased. Thus, light leakage from the resin part 23 can be reduced, and the light extraction efficiency can be improved. By employing the value of 60 mass % or less, flowability of the resin can be improved, and moldability can be improved. In view of an improvement in the light extraction efficiency and in moldability, the content of the light reflective substance in the resin part 23 is more preferably in a range of 10 mass % to 50 mass % inclusive.

The sealing resin 3 is a member having a light transmissive resin material as its main component, and disposed to fill the recess 23a of the resin part 23 to seal the light emitting elements 1 and the protective element 5 mounted on the bottom surface 23b of the recess 23a, respectively. Further, the sealing resin 3 may contain a wavelength converting substance (a fluorescent material) that converts the light emitted by the light emitting element 1 into light of different wavelength. For example, with a configuration where blue light is emitted by the light emitting element 1, and a portion of the blue light is converted by the wavelength converting substance into yellow light, it becomes possible to emit white light that is a mixture of the blue light and the yellow light from the light emitting device 100.

Note that, a plurality of types of wavelength converting substances may be contained in the sealing resin 3. In place of or in addition to the wavelength converting substance, a light diffusing substance may be contained.

The sealing resin 3 is preferably made of a material that exhibits good light transmissive property to the wavelength of light emitted by the light emitting elements 1 and to the wavelength of light emitted by the wavelength converting substance, and exhibits good weather resistance, lightfastness and heat-resistance as the sealing member. As such a material, a resin material similar to that employed for the resin part 23 described above, or glass can be employed. Exemplary materials of the sealing resin 3 may include silicone resin, silicone-modified resin, silicone hybrid resin, fluororesin, fluoro-modified resin, adamantane resin and the like. In particular, silicone resin and fluoro resin are preferable for their high heat-resistance and light resistance. Silicone resin of which index of refraction is 1.4 to 1.6 is preferable. In particular, silicone resin of which index of refraction is 1.41 to 1.55 is more preferable for its high heat-resistance, light resistance, light extraction characteristic, gas barrier characteristic and sulfidation resistance, and well-balanced quality to be used with an LED.

Further, as the wavelength converting substance (the fluorescent material), any substance known in the art can be employed. Exemplary substances include a cerium-activated YAG (yttrium-aluminum-garnet)-base fluorescent material emitting green to yellow-color light, a cerium-activated LAG (lutetium-aluminum-garnet)-base fluorescent material emitting green-color light, an europium and/or chromium-activated nitrogen-containing calcium aluminosilicate (CaO— $Al_2O_3$—$SiO_2$)-base fluorescent material emitting green to red-color light, an europium-activated silicate ((Sr, Ba)$_2$SiO$_4$)-base fluorescent material emitting blue to red-color light, β sialon fluorescent material and a sulfide fluorescent material represented by SrGa$_2$S$_4$:Eu emitting green-color light, a nitride-based fluorescent material such as a CASN-base fluorescent material represented by CaAlSiN$_3$:Eu or a SCASN-base fluorescent material represented by (Sr,Ca)AlSiN$_3$:Eu emitting red-color light, a K$_2$SiF$_6$:Mn (KSF)-base fluorescent material emitting red-color light, and a sulfide-base fluorescent material emitting red-color light.

Further, as the light diffusing substance, a material similar to that employed for the light reflective substance can be employed.

In the case where the die area in a plan view is identical, a polygonal die having five or more corners is greater than a quadrangular die in the total area of the side surfaces. Therefore, the light from the light emitting element 1 can be efficiently emitted to the wavelength converting substance. Accordingly, it becomes possible to disperse the wavelength converting substance around the light emitting element 1 to disperse the emitted heat, and to reduce the use amount of the wavelength converting substance. Hence, deterioration from the heat of the wavelength converting substance can be suppressed, and the reliability of the light emitting device 100 can be improved. In particular, it is extremely effective to the light emitting device including a sulfide-base, fluoride-base, or nitride-based fluorescent material which tends to deteriorate by heat, and heat emission and the use amount of the wavelength converting substance can be reduced to improve the reliability of the light emitting device 100.

Further, as the light diffusing substance contained in the sealing resin 3, specifically, particles of white pigment such as $SiO_2$, $TiO_2$, $ZrO_2$, MgO, $MgCO_3$, $Mg(OH)_2$, $CaCO_3$, $Ca(OH)_2$, $CaSiO_3$, ZnO, $BaTiO_3$, $Al_2O_3$ and the like can be employed.

The average particle size of the particles of the light diffusing substance contained in the sealing resin 3 is preferably from 0.001 μm to 10 μm inclusive. This provides a highly efficient light scattering characteristic. In particular, the average particle size of the particles of the light diffusing substance in the sealing resin 3 is more preferably from 0.001 μm to 0.05 μm inclusive. This provides a high light scattering effect, that is, the Rayleigh scattering effect and the effect of rendering the dispersion state of the wavelength converting substance uniform. Thus, the light extraction efficiency of the light emitting device 100 can be further improved.

Further, by using the particles of the light diffusing substance of which average particle size is preferably in a range of 0.001 μm to 0.05 μm and the above-described wavelength converting substance, particularly the nitride-based fluorescent material such as CASN-base or SCASN-base, the fluoride-base fluorescent material such as KSF-base, and the sulfide-base fluorescent material in combination, the light extraction efficiency can be improved. By virtue of the uniformly dispersed wavelength converting substance and the improved light extraction efficiency, the use amount of the wavelength converting substance can be reduced, whereby an increase in the temperature by the heat emission of the wavelength converting substance can be suppressed. Thus, deterioration of the wavelength converting substance can be reduced, and the reliability of the light emitting device 100 can be improved.

In particular, with the light emitting device 100 having the light emitting elements 1 each being a polygonal die having five of more corners, including a sulfide-base, fluoride-base or nitride-based fluorescent material as the wavelength converting substance, and containing the light diffusing substance of which average particle size is 0.001 μm to 10 μm, deterioration of the sealing resin 3 or the fluorescent material can be reduced, or the light extraction efficiency can be improved.

The wires 4 electrically connect between the external connection portion 13a of the n-side electrode 13 of one light emitting element 1 and the external connection portion 142a of the p-side electrode 14 of other light emitting element 1, between the external connection portion 142a of other light emitting element 1 and the lead electrode 21 of corresponding polarity, and between the external connection portion 13a and the lead electrode 22 of corresponding polarity. Further, the wire 4 is also used to electrically connect between the one electrode of the protective element 5 and the lead electrode 21.

The wires 4 can suitably be made of Au, Cu, Al, or Ag or an alloy containing one of those as a main component.

It is preferable to provide the protective element 5 for protecting the light emitting element 1 from electrostatic discharge. As the protective element 5, a Zener diode may be connected to the light emitting element 1 in parallel and with reverse polarity. Further, as the protective element 5, a varistor, a resistor, a capacitor or the like can also be used.

The protective element 5 is bonded on the lead electrode 22 using the joining member 62 having electrical conductivity, whereby one electrode of the protective element 5 is electrically connected to the lead electrode 22. Further, other electrode of the protective element 5 is connected to the lead electrode 21 using the wire 4.

The die bonding resin 61 is a bonding member for bonding each light emitting element 1 to the lead electrode 21 provided at the bottom surface 23b of the recess 23a.

The die bonding resin 61 is preferably a resin material that is less prone to discolor or deteriorate by the light or heat emitted by the light emitting elements 1, having good light transmissive property, and having an index of refraction equal to or smaller than that of the sealing resin 3. By setting the index of refraction of the die bonding resin 61 to be equal to or smaller than that of the sealing resin 3, the light output from the light emitting element 1 via the die bonding resin 61 will not be totally reflected at the interface between the die bonding resin 61 and the sealing resin 3, and can be efficiently extracted to the outside. As such a resin material, a silicone-base die bonding resin having the siloxane skeleton is preferable. Exemplary silicone-base die bonding resins include silicone resin, silicone hybrid resin, and silicone-modified resin.

In particular, a combination of a polygonal die having five or more corners and a silicone die bonding resin of which index of refraction is equal to or smaller than that of the sealing resin 3 is extremely effective. The lateral side surface area of a polygonal die having five or more corners is greater than that of a quadrangular die. Therefore, the amount of light output from the light emitting element 1 is also greater, and can be efficiently extracted to the outside.

The joining member 62 is an electrically conductive adhesive agent such as solder for joining the protective element 5 to the lead electrode 22 and electrically connecting one electrode of the protective element 5 and the lead electrode 22 to each other.

Operation of Light Emitting Device

Next, with reference to FIG. 1B, a description will be given of the operation of the light emitting device 100.

Note that, for the sake of convenience, it is assumed that the light emitting elements 1 emit blue-color light, and the sealing resin 3 contains the wavelength converting substance that absorbs the blue-color light and emits yellow-color light.

When the light emitting device 100 is connected to the external power supply via the lead electrodes 21, 22, current is supplied to the light emitting elements 1 via the wires 4, and the light emitting elements 1 emit blue-color light. The blue-color light emitted by the light emitting elements 1 is partially converted to yellow-color light by the wavelength converting substance while propagating through the sealing resin 3. Then, the blue-color light and the yellow-color light are partially reflected and partially absorbed at the interfaces of the light emitting elements 1, the die bonding resin 61, the lead electrodes 21, 22, the resin part 23, and the sealing resin 3 provided in the recess 23a, and output as white-color light being the mixture of the blue-color light and the yellow-color light from the opening of the recess 23a of the package 2.

More specifically, part of the light output from the lateral side surfaces of one light emitting element 1 and propagating in the direction parallel to the bottom surface 23b in the sealing resin 3 illuminates the lateral side surfaces of the recess 23a and reflected upward, thereby extracted to the outside. Further, other part of the light enters the adjacent other light emitting element 1 from the lateral side surfaces of the adjacent light emitting element 1. Though the light entering the light emitting elements 1 is partially extracted to the outside by the route described above, the remainder is absorbed in the light emitting elements 1. This causes a reduction in the light extraction efficiency. In particular, in the case where one of the lateral sides of adjacent two light emitting elements 1 are arranged in parallel to each other, the amount of light emitted from one light emitting element 1 entering the adjacent light emitting elements 1 increases.

In the present embodiment, the two light emitting elements 1 each have an outer shape of an approximately regular hexagon in a plan view. The light emitting elements 1 are disposed such that the lateral sides of respective approximately regular hexagons oppose to each other not in parallel. Therefore, the proportion of the light output from the lateral side surfaces of one light emitting element 1 entering other light emitting element can be reduced. Therefore, the amount of light absorbed in the light emitting elements 1 reduces, and consequently the light extraction efficiency to the outside improves.

Further, as compared to the case where light emitting elements having square outer shape are arranged at positions rotated by 45° about an axis perpendicular to the main surface, the proportion of the area of the light emitting elements per area required for the arrangement can be increased. That is, such an outer shape of the light emitting elements 1 and disposition of the light emitting elements 1 in the recess 23a can improve the mounting efficiency, in terms of area, of the light emitting elements 1 in the mounting region of the package 2. Therefore, despite the package 2 being of the conventional size, the output of the light emitting device 100 can be increased. Further, in place of or in addition to the increase in the output of the light emitting device 100, the size of the light emitting device 100 can be reduced than the conventional light emitting device.

Comparative Experiment of Luminous Flux

Next, with reference to FIG. 1B and FIGS. 3A to 4C, a description will be given of an experiment in which comparison is made as to the luminous flux output from the light emitting devices each mounting two light emitting elements, the light emitting devices differing from each other in the shape and disposition of the light emitting elements.

Figure 3A:
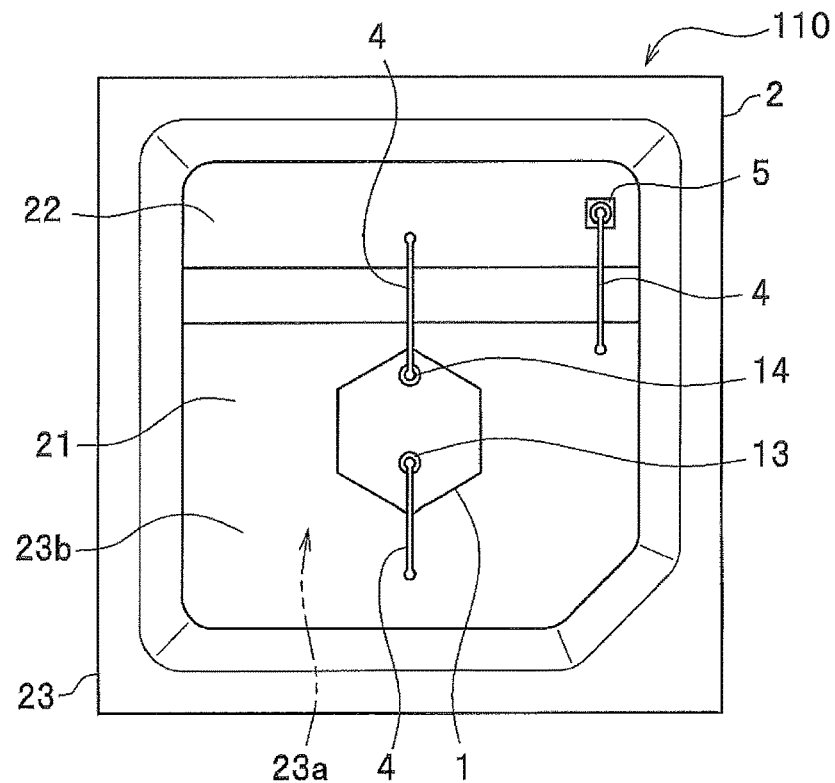
FIG. 3A is a schematic plan view showing the configuration of a light emitting device according to Reference Example.
Figure 3B:
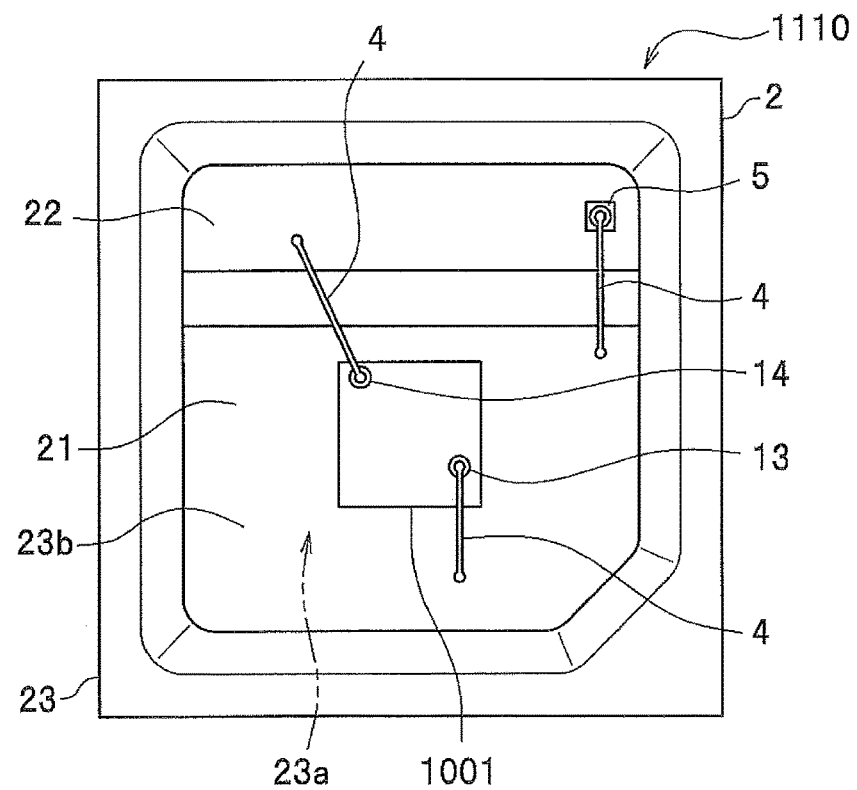
FIG. 3B is a schematic plan view showing the configuration of a light emitting device according to Reference Example.
Figure 4A:
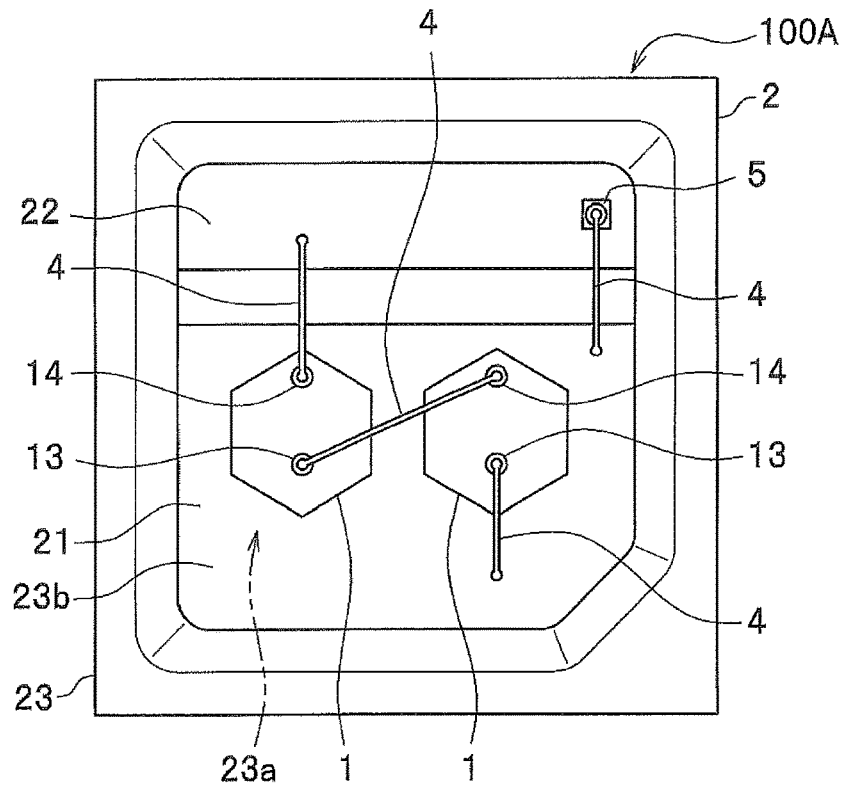
FIG. 4A is a schematic plan view showing the configuration of a light emitting device according to Experimental Example.
Figure 4B:
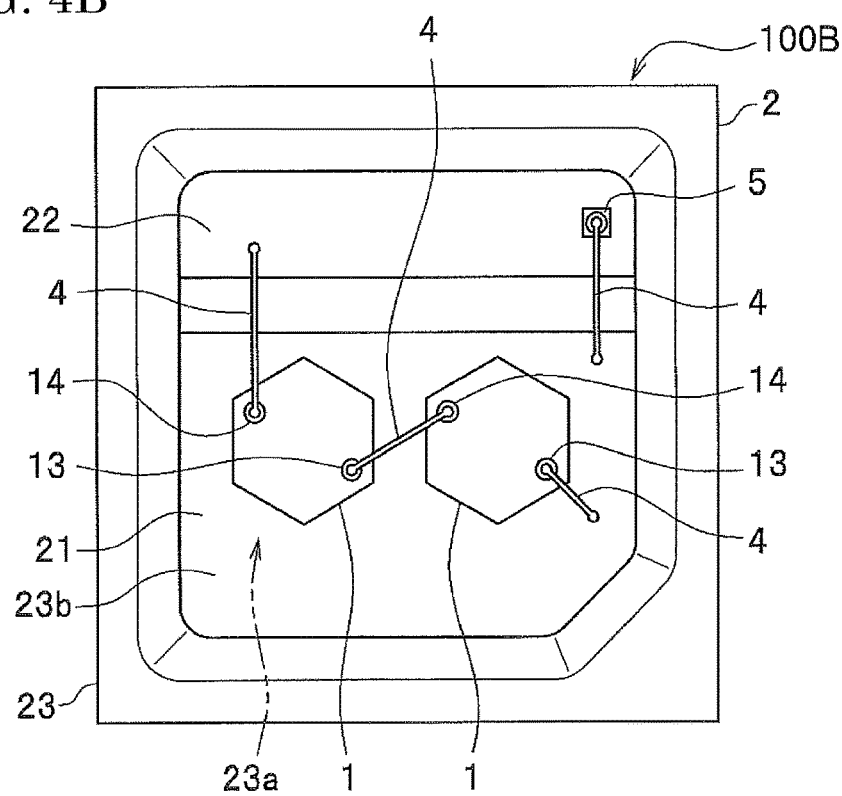
FIG. 4B is a schematic plan view showing the configuration of a light emitting device according to Experimental Example.
Figure 4C:
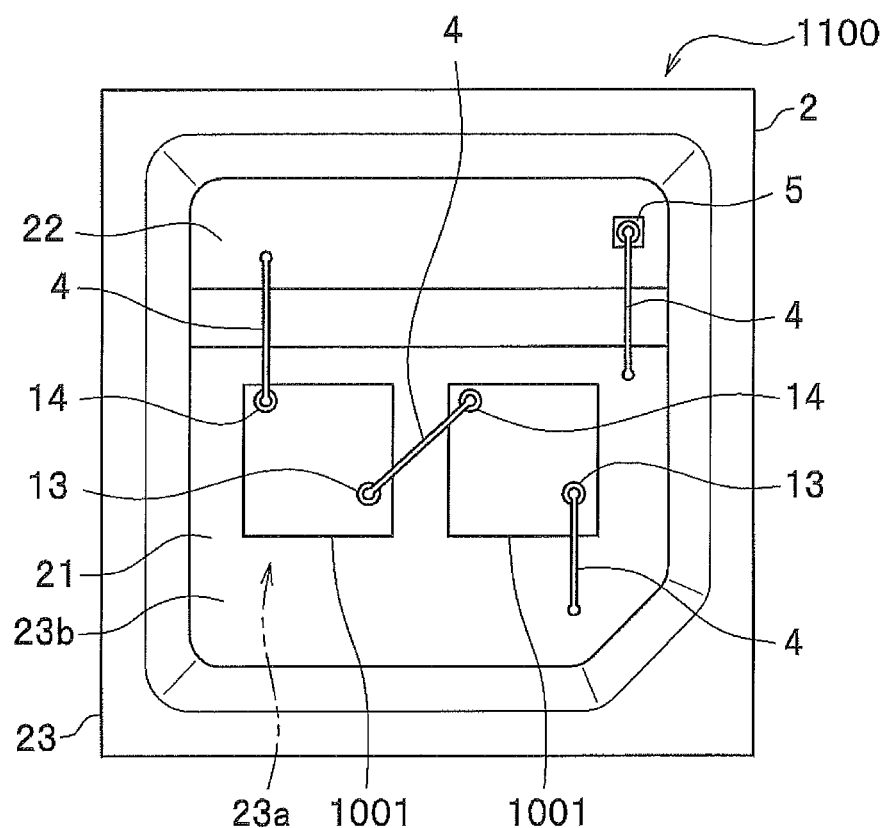
FIG. 4C is a schematic plan view showing the configuration of a light emitting device according to Comparative Example.

FIG. 3A is a schematic plan view showing the configuration of a light emitting device according to Reference Example. FIG. 3B is a schematic plan view showing the configuration of the light emitting device according to Reference Example. FIG. 4A is a schematic plan view showing the configuration of a light emitting device according to Experimental Example. FIG. 4B is a schematic plan view showing the configuration of the light emitting device according to Experimental Example. FIG. 4C is a schematic plan view showing the configuration of a light emitting device according to Comparative Example.

In the present experiment, what were prepared were light emitting devices 100, 100A, 100B according to Experimental Examples of the first embodiment in each of which two light emitting elements 1 of which outer shape is an approximately regular hexagon were mounted, and a light emitting device 1100 according to Comparative Example in which two light emitting elements 1001 of which outer shape was approximately square were mounted. The luminous flux of the output light of the light emitting devices 100, 100A, 100B, 1100 was measured and the light emitting devices 100, 100A, 100B, 1100 were compared against each other as to the luminous flux.

Further, as Reference Examples, a light emitting device 110 in which one light emitting element 1 was mounted and a light emitting device 1110 in which one light emitting element 1001 was mounted were prepared, and the light emitting device 110 and the light emitting device 1110 were compared against each other as to the luminous flux.

Note that, the light emitting devices 100A, 100B are Variations of the light emitting device 100 according to the first embodiment.

Further, the light emitting element 1 and the light emitting element 1001 have outer shapes of approximately the same planar dimensions. The light emitting element 1001 has an approximately square outer shape with a side of about 612 µm. The wires 4 are provided so that the length of the wires are approximately the same at the corresponding portions of the light emitting device 110 and the light emitting device 1110. The light emitting elements 1, 1001 each has a thickness of about 150 µm and the opening width of the recess of the package 2 of about 2.6 mm.

When the luminous flux of the light emitting device 1110 in which one light emitting element 1001 is mounted was 100%, the luminous flux of the light emitting device 110 in which one light emitting element 1 was mounted was 99.95%, and thus it was confirmed that they exhibited practically the same luminous flux.

In the light emitting device 1100 illustrated as Comparative Example, two light emitting elements 1001 are disposed such that one sides of the approximately square outer shapes of the light emitting elements 1001 are arranged facing each other in parallel in a plan view.

Further, in the light emitting device 100A, two light emitting elements 1 are disposed such that respective one sides of the approximately regular hexagonal outer shapes of the light emitting elements 1 are arranged facing each other in parallel in a plan view. Here, the external connection portion of the n-side electrode 13 and the external connection portion of the p-side electrode 14 are disposed so as to be in parallel to the above-described one sides of the outer shape hexagons, and the length of the wire 4 connecting between the light emitting elements 1 is substantially identical to that in the light emitting device 1100.

When the luminous flux of the light emitting device 1100 was 100%, the luminous flux of the light emitting device 100A was about 100.2%, and thus it was found that the output of the light emitting device 100A was improved as compared to the light emitting device 1100.

Similarly to the light emitting device 100A, in the light emitting device 100B, two light emitting elements 1 are disposed such that respective one sides of the approximately regular hexagonal outer shapes of the light emitting elements 1 are arranged facing each other in parallel in a plan view. Here, the length of the wire 4 connecting between the light emitting elements 1 are shorter than that in the light emitting device 100A, because the light emitting elements 1 are disposed such that the external connection portion of the n-side electrode 13 of the left light emitting element 1 and the external connection portion of the p-side electrode 14 of the right light emitting element 1 are in close proximity to each other.

The luminous flux of the light emitting device 100B was about 100.6%, and it was found that the output was improved as compared to the light emitting device 100A.

In this manner, by shortening the wiring length of the wire 4 connecting between the light emitting elements 1, absorption or reflection of light by the wire 4 is suppressed, whereby the light extraction efficiency can be improved.

As has been described above, in the light emitting device 100, two light emitting elements 1 are disposed such that respective one corner of the approximately regular hexagonal outer shape of the light emitting elements 1 in a plan view are facing each other while facing sides are not in parallel to each other. Here, the external connection portion of the n-side electrode 13 and the external connection portion of the p-side electrode 14 respectively provided around the vertexes in close proximity to each other are connected to each other by the wire 4. Thus, the light emitting elements 1 are disposed such that the wiring length of the wire 4 between the light emitting elements 1 is almost minimized.

The luminous flux of the light emitting device 100 was about 101.5%, and it was found that the output was further improved even as compared to the light emitting device 100B.

As described above, by the present experiment, it was found that the output becomes greater as respective lateral side surfaces of the adjacent light emitting elements 1 oppose to each other in parallel by a smaller area, and further preferably as the wiring length of the wire 4 connecting between the light emitting elements 1 is shorter.

Method of Manufacturing Light Emitting Device

Next, with reference to FIGS. 5A to 7C, a description will be given of a method of manufacturing the light emitting device 100.

Figure 5A:
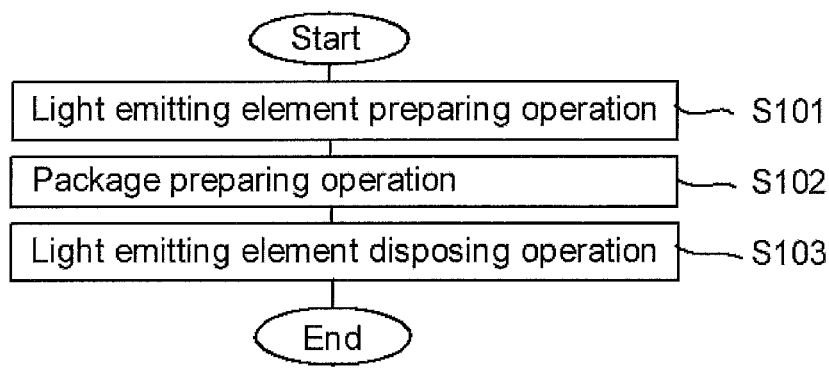
FIG. 5A is a flowchart showing an example of a procedure of a method of manufacturing the light emitting device according to the first embodiment.
Figure 5B:
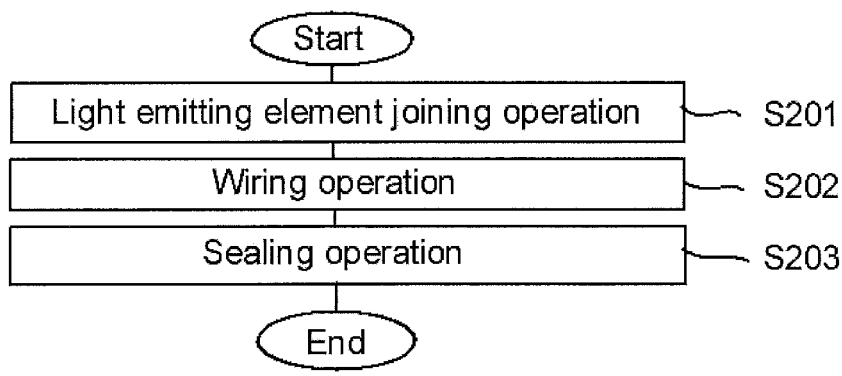
FIG. 5B is a flowchart showing details of a light emitting element disposing operation in the method of manufacturing the light emitting device according to the first embodiment.
Figure 6A:
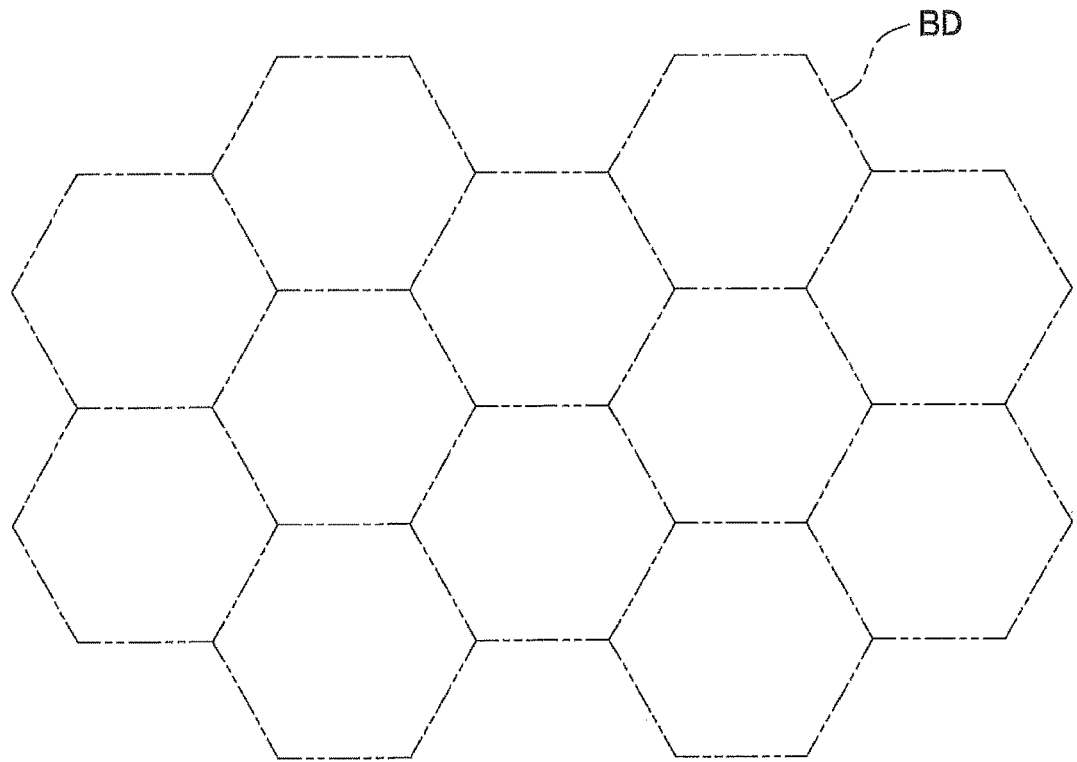
FIG. 6A is a schematic plan view showing boundary lines virtually partitioning a wafer in a light emitting element preparing operation in the method of manufacturing the light emitting device according to the first embodiment.
Figure 6B:
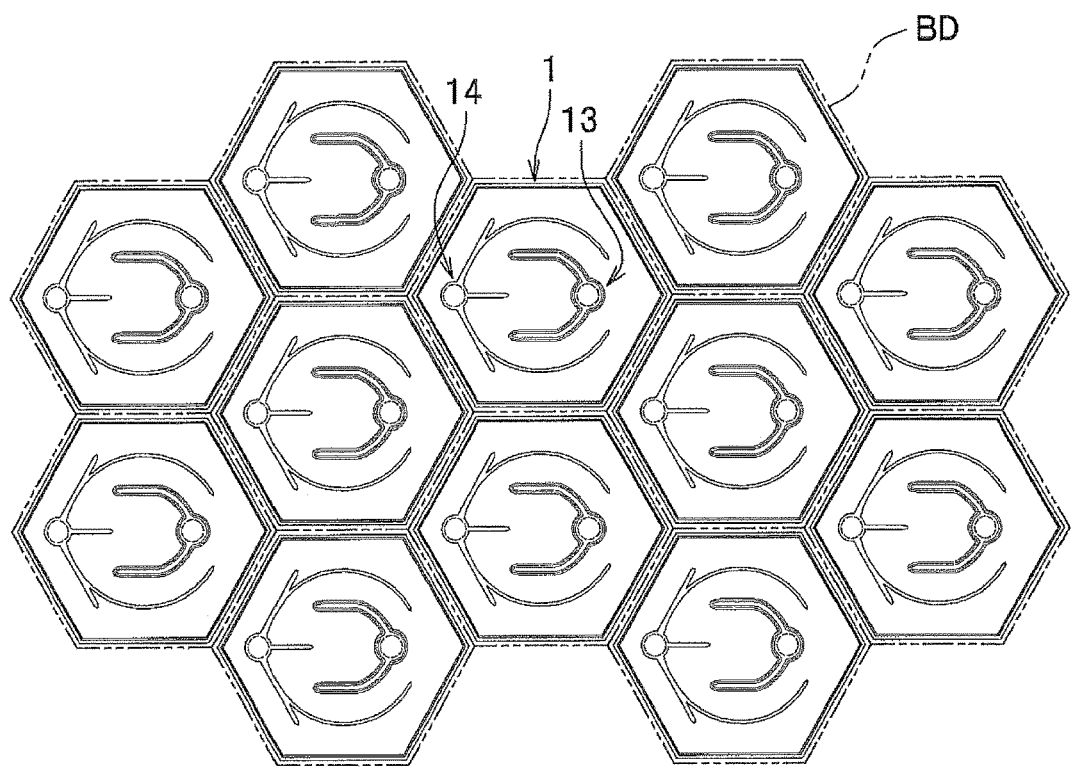
FIG. 6B is a schematic plan view showing the state where light emitting elements are formed on the wafer in the light emitting element preparing operation in the method of manufacturing the light emitting device according to the first embodiment.
Figure 7A:
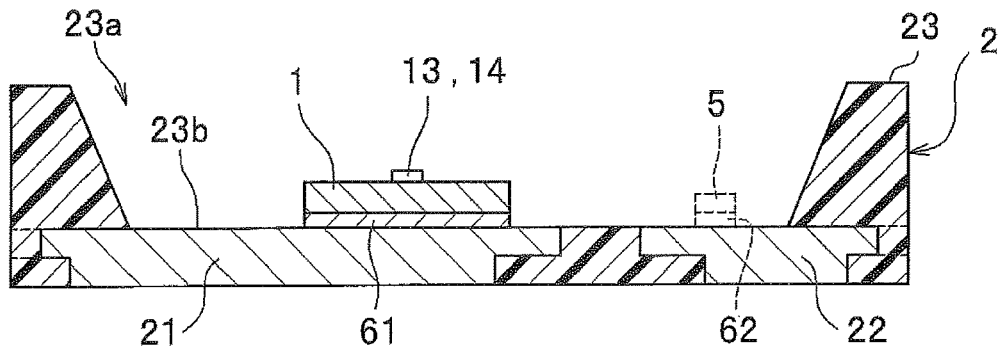
FIG. 7A is a schematic cross-sectional view showing a light emitting element joining operation being a subordinate operation in the light emitting element disposing operation in the method of manufacturing the light emitting device according to the first embodiment.
Figure 7B:
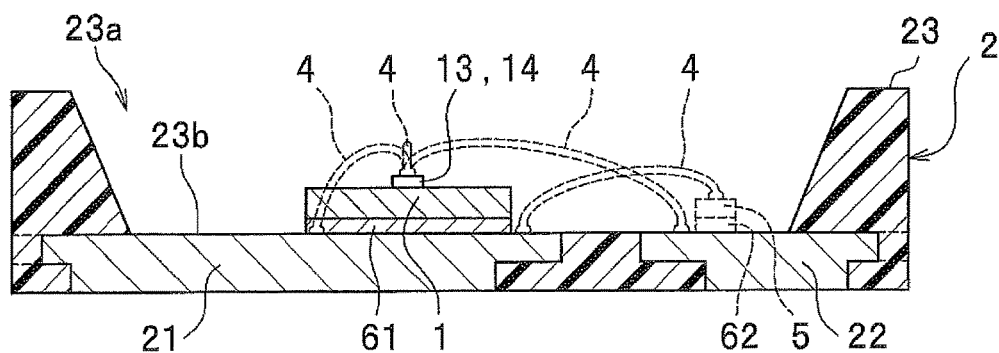
FIG. 7B is a schematic cross-sectional view showing a wiring operation being a subordinate operation in the light emitting element disposing operation in the method of manufacturing the light emitting device according to the first embodiment.
Figure 7C:
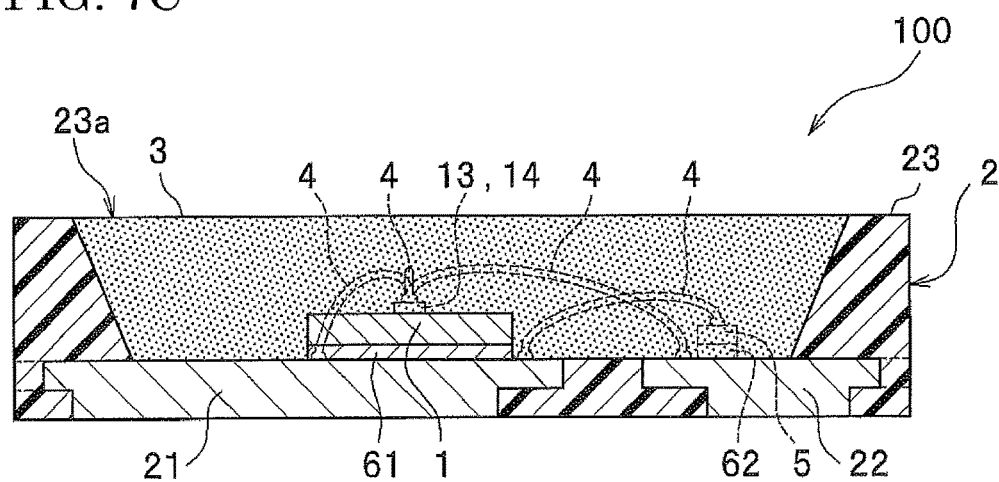
FIG. 7C is a schematic cross-sectional view showing a sealing operation being a subordinate operation in the light emitting element disposing operation in the method of manufacturing the light emitting device according to the first embodiment.
Figure 8A:
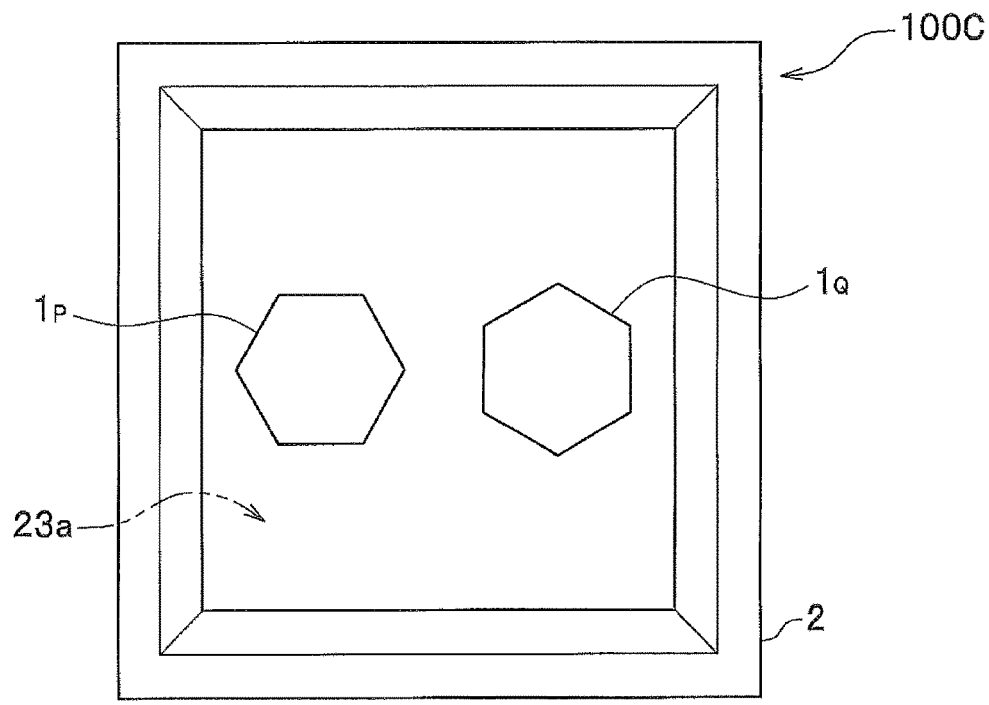
FIG. 8A is a schematic plan view showing the configuration of a light emitting device according to Variation of the first embodiment.
Figure 8B:
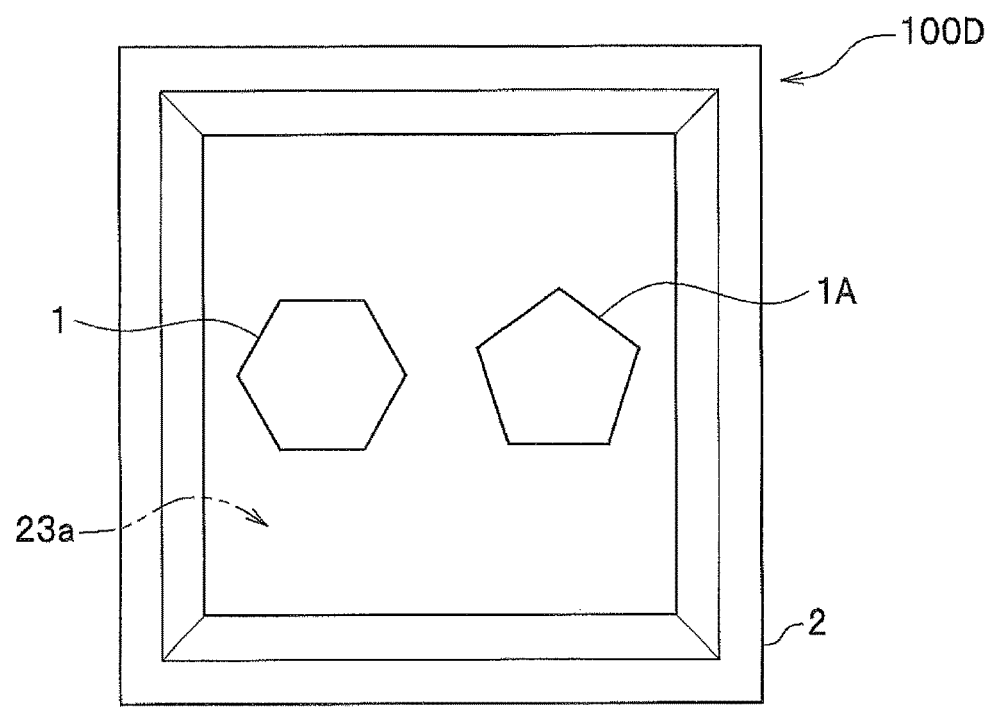
FIG. 8B is a schematic plan view showing the configuration of a light emitting device according to Variation of the first embodiment.
Figure 9A:
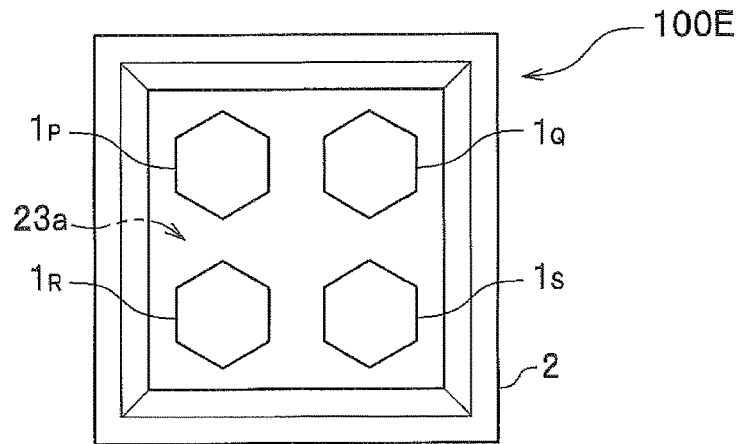
Figure 9B:
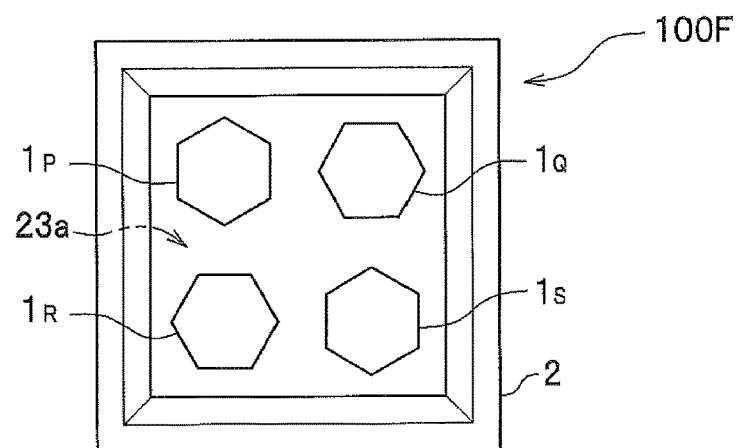
FIG. 9B is a schematic plan view showing the configuration of a light emitting device according to Variation of the first embodiment.
Figure 9C:
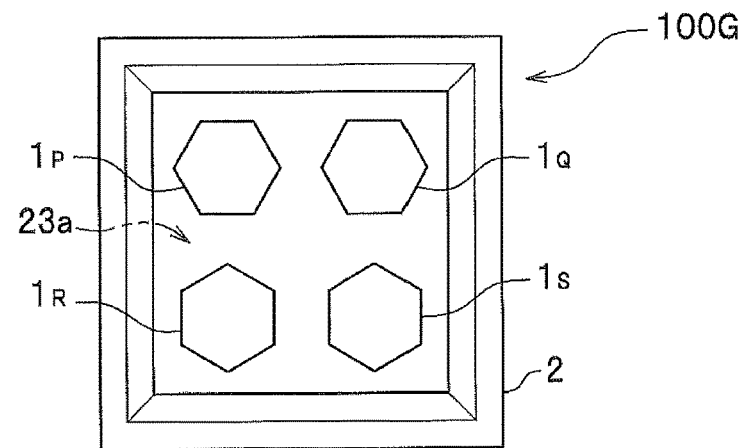
FIG. 9C is a schematic plan view showing the configuration of a light emitting device according to Variation of the first embodiment.
Figure 9D:
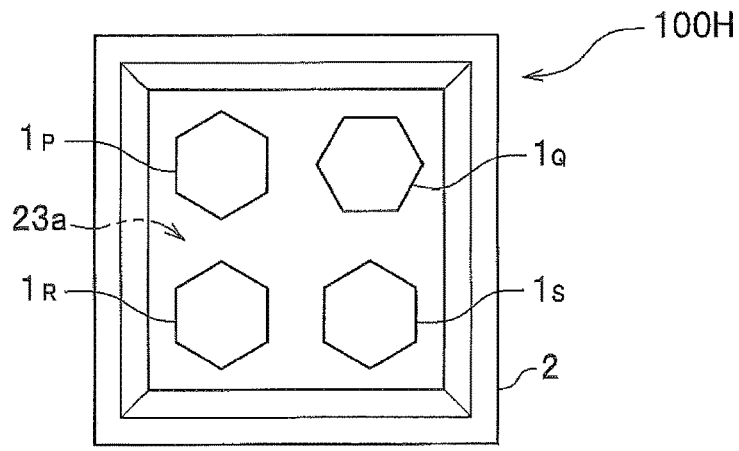
FIG. 9D is a schematic plan view showing the configuration of a light emitting device according to Variation of the first embodiment.
Figure 9E:
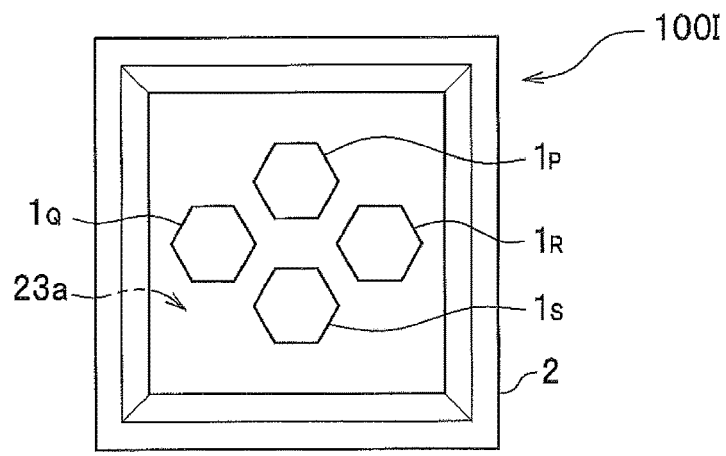
FIG. 9E is a schematic plan view showing the configuration of a light emitting device according to Variation of the first embodiment.
Figure 9F:
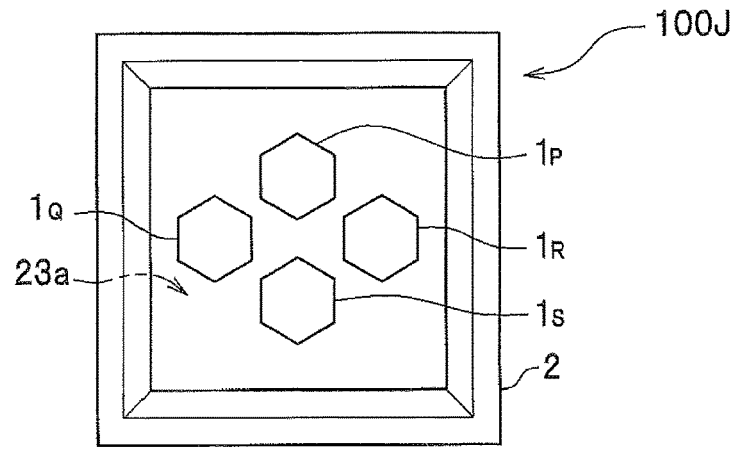
FIG. 9F is a schematic plan view showing the configuration of a light emitting device according to Variation of the first embodiment.
Figure 10A:
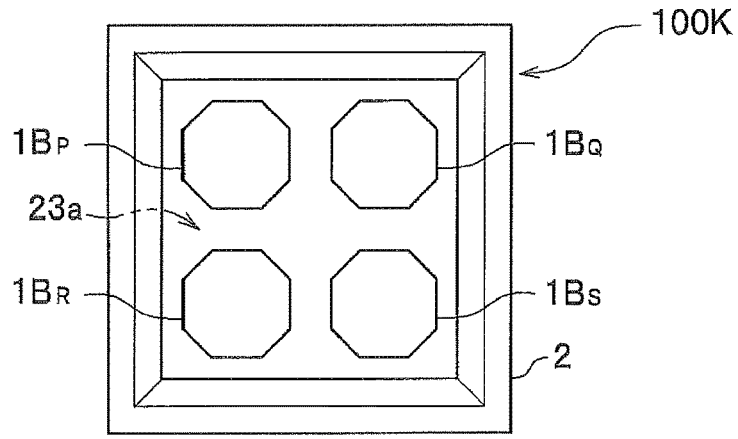
FIG. 10A is a schematic plan view showing the configuration of a light emitting device according to Variation of the first embodiment.
Figure 10B:
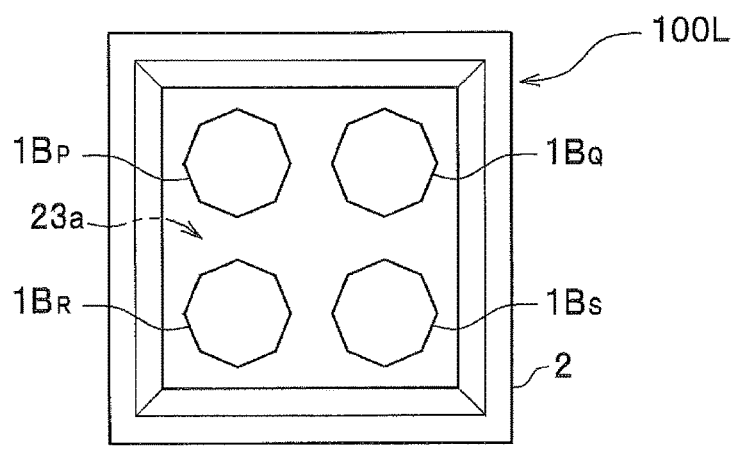
FIG. 10B is a schematic plan view showing the configuration of a light emitting device according to Variation of the first embodiment.
Figure 10C:
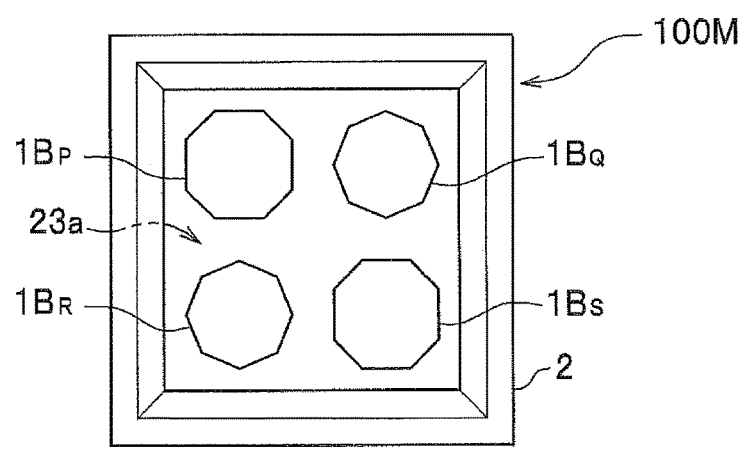
FIG. 10C is a schematic plan view showing the configuration of a light emitting device according to Variation of the first embodiment.
Figure 10D:
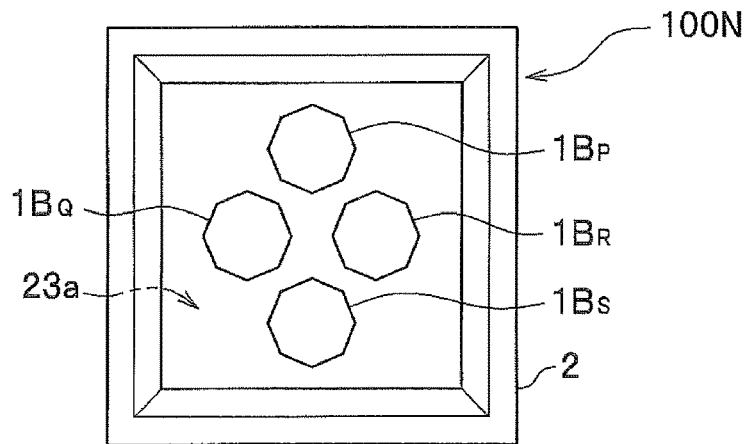
FIG. 10D is a schematic plan view showing the configuration of a light emitting device according to Variation of the first embodiment.
Figure 10E:
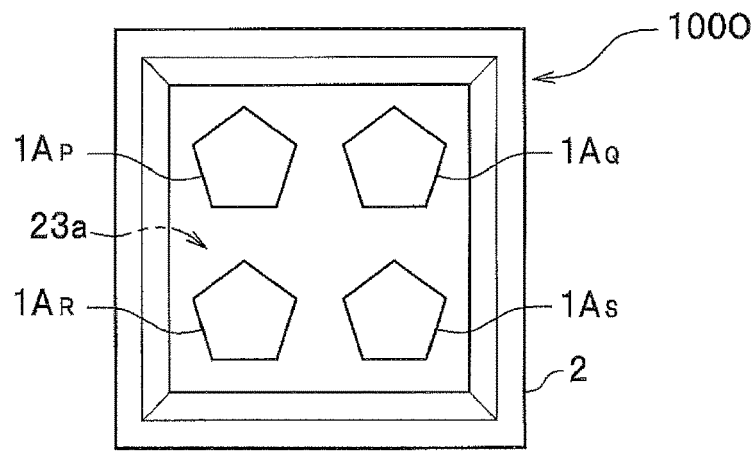
FIG. 10E is a schematic plan view showing the configuration of a light emitting device according to Variation of the first embodiment.
Figure 10F:
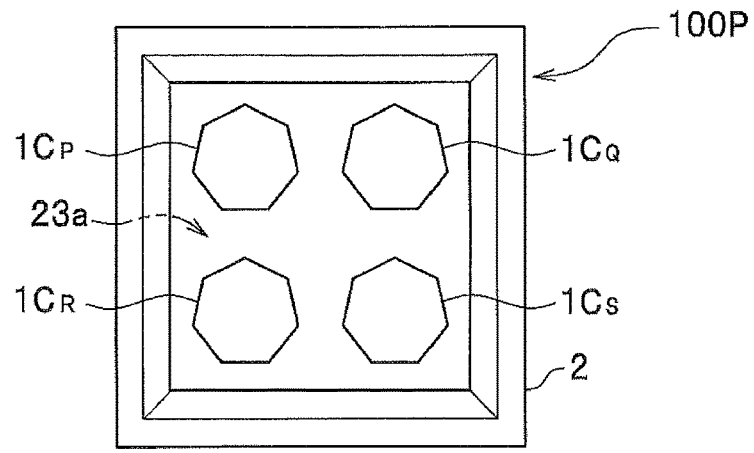
FIG. 10F is a schematic plan view showing the configuration of a light emitting device according to Variation of the first embodiment.

FIG. 5A is a flowchart showing the procedure of the method of manufacturing the light emitting device according to the first embodiment. FIG. 5B is a flowchart showing details of a light emitting element disposing operation in the method of manufacturing the light emitting device according to the first embodiment. FIG. 6A is a schematic plan view showing boundary lines virtually partitioning a wafer in a light emitting element preparing operation in the method of manufacturing the light emitting device according to the first embodiment. FIG. 6B is a schematic plan view showing the state where light emitting elements are formed on the wafer in the light emitting element preparing operation in the method of manufacturing the light emitting device according to the first embodiment. FIG. 7A is a schematic cross-sectional view showing a light emitting element joining operation being a subordinate operation in the light emitting element disposing operation in the method of manufacturing the light emitting device according to the first embodiment. FIG. 7B is a schematic cross-sectional view showing a wiring operation being a subordinate operation in the light emitting element disposing operation in the method of manufacturing the light emitting device according to the first embodiment. FIG. 7C is a schematic cross-sectional view showing a sealing operation being a subordinate operation in the light emitting element disposing operation in the method of manufacturing the light emitting device according to the first embodiment.

Method of Manufacturing Light Emitting Device

The method of manufacturing the light emitting device 100 according to the first embodiment includes a light emitting element preparing operation S101, a package preparing operation S102, and a light emitting element disposing operation S103.

The light emitting element preparing operation S101 is an operation of preparing a singulated light emitting element 1 of the configuration as shown in FIGS. 2A and 2B.

In the following, a description will be given of an exemplary operation of manufacturing the light emitting element 1 in a wafer-level process. However, an embodiment of the present invention is not limited thereto. Note that, in manufacturing the light emitting element 1 in a wafer-level process, for example as shown in FIG. 6A, boundary lines BD being the virtual lines partitioning the individual light emitting element 1 are defined, and a plurality of light emitting elements 1 of an identical shape are formed.

Semiconductor Stacked-Layer Body Forming Operation

Specifically, firstly, on the substrate 11 of sapphire or the like, through MOCVD or the like, the n-type semiconductor layer 12n, the active layer 12a and the p-type semiconductor layer 12p are successively stacked using the semiconductor materials noted above, to obtain the semiconductor stacked-layer body 12. Thereafter, the p-type semiconductor layer 12p is subjected to p-type annealing.

N-Type Semiconductor Layer Exposing Operation

When the semiconductor stacked-layer body 12 is formed, at part of the surface of the semiconductor stacked-layer body 12, from the upper surface side, the entire p-type semiconductor layer 12p and active layer 12a, and part of the n-type semiconductor layer 12n are removed by etching. Thus, the step portion 12b where the n-type semiconductor layer 12n is exposed at the bottom surface is formed.

Further, simultaneously, the region along the boundary lines BD is etched. Thus, the step portion 12c is formed as the dicing street.

Light Transmissive Electrode Forming Operation

Thereafter, the light transmissive electrode 141 is formed through sputtering or the like using a light transmissive and electrically conductive material such as ITO, so as to cover substantially the entire upper surface of the p-type semiconductor layer 12p.

P-Side Pad Electrode Forming Operation

Further, the pad electrode 142 is formed through sputtering or the like using a metal material such as Cu or Au at part of the upper surface of the light transmissive electrode 141. Thus, the p-side electrode 14 is formed.

N-Side Pad Electrode Forming Operation

Further, at the step portion 12b, the pad electrode 132 is formed through sputtering or the like using a metal material such as Cu or Au at the upper surface of the n-type semiconductor layer 12n. Thus, the n-side electrode 13 is formed.

Note that, the order of forming the n-side electrode 13 and the p-side electrode 14 is not limited, and part of the subordinate operations, for example, formation of the n-side electrode 13 and formation of the p-side pad electrode 142, may be simultaneously performed in an identical subordinate operation.

Protective Film Forming Operation

Next, the protective film 15 covering the entire wafer is formed through sputtering or the like using a light transmissive and electrically insulating material such as $SiO_2$, while forming the openings 15n, 15p at the external connection portions 13a, 142a respectively being the regions at the upper surfaces of the n-side electrode 13 and the pad electrode 142 for connecting to the outside.

Note that, the layers of the n-side electrode 13 and the p-side electrode 14 and the protective film 15 can be patterned by etching or lift-off using a mask which is formed into an appropriate shape by photolithography.

By the foregoing subordinate operations, as shown in FIG. 6B, the light emitting elements 1 in the wafer state can be formed.

Singulating Operation

Next, the light emitting elements 1 are singulated by cutting the wafer along the boundary lines BD. In this singulating operation, it is preferable to use laser dicing capable of performing polygonal cut work, for singulating the light emitting elements 1 partitioned into non-quadrangular shapes. By partitioning a plurality of light emitting elements 1 in a polygonal manner densely on the wafer, the number of light emitting elements 1 that can be manufactured per wafer can further be increased.

Note that, the boundary lines BD may be set such that the wafer can be singulated solely by a straight cutting work through dicing or scribing using a dicing saw.

Further, the back side of the substrate 11 may be polished to reduce the thickness before the wafer is cut. This makes it easier to cut the wafer.

The laser dicing is a scheme of forming cut grooves by emitting laser light (preferably, pulsed laser light of femtoseconds) so as to concentrate inside the substrate 11, and changing the characteristic of the substrate 11 around the focused point. By emitting the laser light to the substrate 11 along the boundary lines BD, polygonal cut grooves can be formed inside the substrate 11. Thereafter, by applying stress to the substrate 11 using, for example, a roller, the wafer can be singulated from the cut grooves formed along the boundary lines BD.

Note that, since the scheme of cutting a wafer into non-quadrangular shape using laser dicing is detailed, for example, in JP 2006-135309 A, a further description will not be given.

The package preparing operation S102 is an operation of preparing the package 2 in the light emitting device 100 shown in FIGS. 1A to 1D. The package 2 prepared in this operation is in the state where the light emitting elements 1 are not mounted and the sealing resin 3 is not provided.

In the package preparing operation S102, in order to prepare the package 2, for example, the package 2 may be manufactured through any molding method using a mold assembly such as transfer molding, compression molding, injection molding, extrusion molding and the like, or a commercially available package may be obtained.

Note that, the order of performing the light emitting element preparing operation S101 and the package preparing operation S102 is not particularly limited, and they may be performed in parallel.

A description will be given of an exemplary method of manufacturing the package 2. The package 2 can be manufactured by: interposing the lead frames (the lead electrodes 21, 22) formed by subjecting a sheet metal to punching work between upper and lower molds having a cavity conforming to the shape of the resin part 23; injecting a resin material from a gate hole provided at part of the mold assembly; curing or hardening the resin material; and taking out the package 2 from the mold assembly. Further, in the case where a plurality of packages 2 being connected to each other by the lead frames is manufactured, the packages 2 are singulated by cutting off the lead frames.

The light emitting element disposing operation S103 is an operation of mounting the light emitting elements 1 prepared in the light emitting element preparing operation S101 on the recess 23a of the package 2 prepared in the package preparing operation S102. More specifically, the light emitting element disposing operation S103 includes, as the subordinate operations, a light emitting element joining operation S201, a wiring operation S202, and a sealing operation S203.

Firstly, in the light emitting element joining operation S201, on the upper surfaces of the lead electrode 21 being the bottom surface 23b of the recess 23a of the package 2, the light emitting elements 1 are bonded using the die bonding resin 61 (preferably, silicone-base die bonding resin). At this time, through dispensing or pin transfer, the die bonding resin 61 of a proper amount is supplied to the bonded sites on the upper surface of the lead electrode 21. Then, the light emitting elements 1 are transferred using a collet or the like to the bonded sites where the die bonding resin 61 is disposed, having the surface provided with the n-side electrode 13 and the p-side electrode 14 faced up. The surfaces of the light emitting elements 1 on the substrate 11 side and the upper surface of the lead electrode 21 are bonded, with the sides of the hexagons being the outer shape of the two light emitting elements 1 in a plan view at least partially opposing to each other not in parallel.

Further, in this step, the protective element 5 is bonded to the lead electrode 22 using the electrically conductive joining member 62.

Next, in the wiring operation S202, the wires 4 are arranged among the n-side electrode 13, the p-side electrode 14 and the lead electrodes 21, 22 such that the two light emitting elements 1 are connected in series between the lead electrodes 21, 22. Further, the wire 4 is arranged such that the electrode provided on the upper surface side of the protective element 5 and the lead electrode 21 are connected to each other. The wires 4 can be arranged using a wire bonding apparatus.

Next, in the sealing operation S203, the sealing resin 3 in the liquid state is packed in the recess 23a of the package 2 through potting or the like, and thereafter the sealing resin 3 is cured. Thus, the light emitting elements 1 are sealed. The sealing resin 3 may be made of light transmissive resin containing particles of a fluorescent material (a wavelength converting substance) or particles of a light diffusing substance.

Through the procedure described above, the light emitting device 100 can be manufactured.

Variations

Next, with reference to FIGS. 8A to 10F, a description will be given of light emitting devices according to Variations of the first embodiment. FIGS. 8A to 10F are each a schematic plan view showing the configuration of the light emitting device according to Variation of the first embodiment.

Note that, FIGS. 8A to 10F show the configuration of light emitting devices 100C to 100P in a simplified manner. That is, in connection with the package 2, only the recess 23a being the region for mounting the light emitting elements 1 and of which opening and bottom surface are each square in a plan view is shown. In connection with the light emitting elements, only the outer shape in a plan view is shown. Further, other members such as the protective element and the wires are omitted.

Further, the reference character subscripts "P, Q, R, S" relating to the light emitting elements 1 are provided for identifying the light emitting elements 1, and light emitting elements $1_P$, $1_Q$, $1_R$, $1_S$ is have the same configuration as the light emitting element 1 shown in FIGS. 2A and 2B. The same holds true for the reference character subscripts "P, Q, R, S" relating to the light emitting elements 1A, 1B, 1C.

In the light emitting device 100C, two light emitting elements $1_P$, $1_Q$ each having an outer shape of an approximately regular hexagon are aligned in the lateral direction. In a plan view, one side of one light emitting element $1_Q$ and an angle (vertex) of other light emitting element $1_P$ oppose to each other. Therefore, between the light emitting element $1_P$ and the light emitting element $1_Q$, no lateral side surfaces oppose to each other in parallel.

In the light emitting device 100D, the light emitting element 1 having an outer shape of an approximately regular hexagon and the light emitting element 1A having an outer shape of an approximately regular pentagon are aligned in the lateral direction. In this manner, the polygons differing in the number of corners may be disposed in combination.

In the light emitting devices 100E to 100H, four light emitting elements $1_P$, $1_Q$, $1_R$, $1_S$ each having an outer shape of an approximately regular hexagon are square arrayed two dimensionally.

In the light emitting device 100E, a pair of the light emitting element $1_P$ and the light emitting element $1_Q$ adjacent to each other in the lateral direction and a pair of the light emitting element $1_R$ and light emitting element $1_S$ adjacent to each other in the lateral direction are disposed such that respective one sides of the approximately regular hexagons in each pair in a plan view are in parallel to each other. In this case also, other two sides of the approximately regular hexagons in each pair opposing in the lateral direction do not oppose to the counterpart two sides in parallel. Further, in connection with a pair of the light emitting element $1_P$ and the light emitting element $1_R$ adjacent to each other in the longitudinal direction and a pair of the light emitting element $1_Q$ and the light emitting element $1_S$ adjacent to each other in the longitudinal direction, corners oppose to the counterpart and none of the sides oppose to the counterpart in parallel between the pairs in a plan view.

In this manner, in the case where all the plurality of light emitting elements 1 are square arrayed two dimensionally in the same orientation, at least part of the sides can be avoided from opposing to each other in parallel.

In the light emitting device 100F, the light emitting elements 1 adjacent to each other in the longitudinal and lateral directions are rotated by 30° (or 30°+60°×N (N is an integer)) relative to each other about an axis perpendicular to the upper surface. That is, the light emitting elements 1 adjacent to each other in the longitudinal and lateral directions oppose to each other such that one side of one light emitting element 1 and one corner of other light emitting element 1 oppose to each other in a plan view. Therefore, the light emitting elements 1 adjacent to each other in the longitudinal direction or in the lateral direction are disposed such that their respective sides do not oppose to each other in parallel in a plan view.

In the light emitting device 100G, the light emitting elements 1 adjacent to each other in the lateral direction are disposed as being oriented in the same direction, and the light emitting elements 1 adjacent to each other in the longitudinal direction are rotated by 30° (or 30°+60°×N (N is an integer)) relative to each other about an axis perpendicular to the upper surface. In more detail, the light emitting element $1_P$ and the light emitting element $1_Q$ are disposed such that their respective one corners oppose to each other in the lateral direction, and the light emitting element $1_R$ and the light emitting element $1_S$ are disposed such that their respective one sides oppose to each other in parallel in the lateral direction. Therefore, in connection with the light emitting elements 1 adjacent to each other in the longitudinal direction, one side of one light emitting element 1 and one corner of other light emitting element 1 oppose to each other.

In the light emitting device 100H, three light emitting elements $1_P$, $1_R$, $1_S$ is are arranged orienting in the same direction, and the light emitting element $1_Q$ is rotated by 30° (or 30°+60°×N (N is an integer)) relative to other light emitting element $1_P$ and others about an axis perpendicular to the upper surface. Therefore, between the light emitting element $1_R$ and the light emitting element $1_S$, their respective one sides oppose to each other in parallel, whereas between the light emitting element $1_P$ and the light emitting element $1_Q$, one side of the light emitting element $1_P$ and one corner of the light emitting element $1_Q$ oppose to each other and their respective sides do not oppose to each other. In this manner, by simply changing the orientation of one of a plurality of light emitting elements 1, the number of mutually facing lateral sides of adjacent ones of light emitting elements that are in parallel to each other in a plan view can be reduced.

In the light emitting devices 100I, 100J, four light emitting elements 1 are all oriented in the same direction, and disposed in a zigzag manner two dimensionally.

In the light emitting device 100I, the light emitting elements $1_P$, $1_S$ arranged in odd rows (the first and third rows) are disposed close to each other, and such that their respective one sides oppose to each other. Further, the light emitting elements $1_Q$, $1_R$ arranged in an even row (the second row) are disposed spaced apart from each other having the light emitting elements $1_P$, $1_S$ in the upper and lower rows interposed therebetween, and such that their respective one corners oppose to each other.

Further, as compared to the square array, since the four light emitting elements 1 are densely disposed in one direction (the longitudinal direction), a greater number of light emitting elements 1 can be arranged in a certain area.

Here, in connection with the light emitting elements 1 adjacent to each other in a diagonal direction, for example the light emitting element $1_P$ and the light emitting element $1_Q$, part of their respective one sides oppose to each other in parallel. Further, while the light emitting elements $1_P$, $1_S$ adjacent to each other in the longitudinal direction have their respective one sides opposed to each other in parallel, they are spaced apart as compared to the case when being square arrayed. Accordingly, the length of the sides opposing to each other in parallel can be shortened than in the case where the light emitting elements having an outer shape of a square are square arrayed in the same direction. Hence, the amount of light exchanged between the lateral side surfaces of the light emitting elements 1 can be reduced.

In the light emitting device 100J, the light emitting elements $1_P$, $1_S$ arranged in odd rows (the first and third rows) are disposed close to each other, and such that their respective one corners oppose to each other in the longitudinal direction. Further, the light emitting elements $1_Q$, $1_R$ in an even row (the second row) are disposed spaced apart from each other having the light emitting elements $1_P$, $1_S$ in the upper and lower rows interposed therebetween, and such that their respective one sides oppose to each other in parallel. While the light emitting elements $1_Q$, $1_R$ have their respective one sides opposed to each other in parallel, they are spaced apart. Hence, the amount of light exchanged between the lateral side surfaces of the light emitting elements $1_Q$, $1_R$ can be reduced. Further, in the light emitting device 100J, similarly to the light emitting device 100I, the four light emitting elements 1 are densely arranged in one direction (the longitudinal direction). Further, in the light emitting device 100J, since the light emitting elements 1 are disposed such that the smallest width direction of each light emitting element 1 in a plan view (the direction perpendicular to one side of the hexagon) agrees with the above-described densely arranged direction, the light emitting element 1 can be more densely arranged.

In light emitting devices 100K to 100N, four light emitting elements 1B each having an outer shape of an approximately regular octagon are arranged.

In the light emitting device 100K, the four light emitting elements 1B are all square arrayed two dimensionally as being oriented in the same direction. In a plan view, respective one side of the approximately regular octagons being the outer shape of the light emitting elements 1B adjacent to each other in the longitudinal and lateral directions are opposed to each other in parallel. Therefore, in the light emitting device 100K, other two sides opposing to each other between the adjacent light emitting elements 1 do not oppose to each other in parallel.

In the light emitting device 100L, the four light emitting elements 1B are all square arrayed two dimensionally as being oriented in the same direction. The light emitting elements 1B are rotated by 22.5° (or 22.5°+45°×N (N is an integer)) about an axis perpendicular to the upper surface. Therefore, in the light emitting device 100L, while all the light emitting elements 1B are oriented in the same direction, in a plan view, their respective corners oppose to each other and their respective sides do not oppose to each other in parallel.

In the light emitting device 100M, the four light emitting elements 1B are square arrayed two dimensionally, and the light emitting elements 1B adjacent to each other in the longitudinal and lateral directions are rotated by 22.5° (or 22.5°+45°×N (N is an integer)) relative to each other about an axis perpendicular to the upper surface. Therefore, the light emitting elements 1B adjacent to each other in the longitudinal and lateral directions have none of their respective sides opposed to each other in parallel.

In the light emitting device 100N, the four light emitting elements 1B are all disposed in a staggered arrangement two dimensionally as being oriented in the same direction. The light emitting elements 1B are rotated such that their respective sides are inclined by 22.5° relative to the longitudinal direction or the lateral direction. Further, the light emitting elements $1B_P$, $1B_S$ in an even column (the second column) are disposed as being spaced apart from each other, having the light emitting elements $1B_Q$, $1B_R$ arranged in the right and left columns interposed therebetween, and such that respective one corners of the light emitting elements $1B_P$, $1B_S$ oppose to each other in close proximity. The light emitting elements 1B adjacent to each other in a diagonal direction (for example, a pair of the light emitting element $1B_P$ and the light emitting element $1B_Q$) have only part of their respective one sides oppose to each other in parallel, and other sides do not oppose to each other in parallel. Further, as compared to the square array arrangement, since the four light emitting elements 1B are densely disposed in one direction (the lateral direction), a greater number of light emitting elements 1 can be disposed in a certain area.

In the light emitting device 100O, four light emitting elements 1A each having an outer shape of an approximately regular pentagon are square arrayed all being oriented in the same direction. Further, in the light emitting device 100P, four light emitting elements 1C each having an outer shape of an approximately regular heptagon are square arrayed all being oriented in the same direction.

As in the case of the light emitting devices 100O, 100P, when there are no combinations of sides of light emitting elements being parallel to each other, even when the light emitting elements are square arrayed all being oriented in the same direction, the adjacent light emitting elements 1A, 1C have none of their respective sides paralleled to each other.

Note that, the outer shape of each light emitting element mounted in the light emitting device is not limited to an approximately regular polygon, and just required to be a convex polygon having five or more corners and in which every interior angle is less than 180°. Further, as the outer shape of the light emitting element approximates a circle, the light extracted from the side surfaces of each light emitting element reduces. Therefore, the outer shape is preferably a polygon having eight or less corners.

Further, the number of light emitting elements mounted on the light emitting device is not limited to two or four, and may be three or five or more. Still further, the region where the light emitting elements are mounted is not limited to a square or an approximately square region, and may be set to be rectangular, circular, or polygonal as appropriate.

Second Embodiment

Next, with reference to FIGS. 11A and 11B, a description will be given of a light emitting device according to a second embodiment.

Figure 11A:
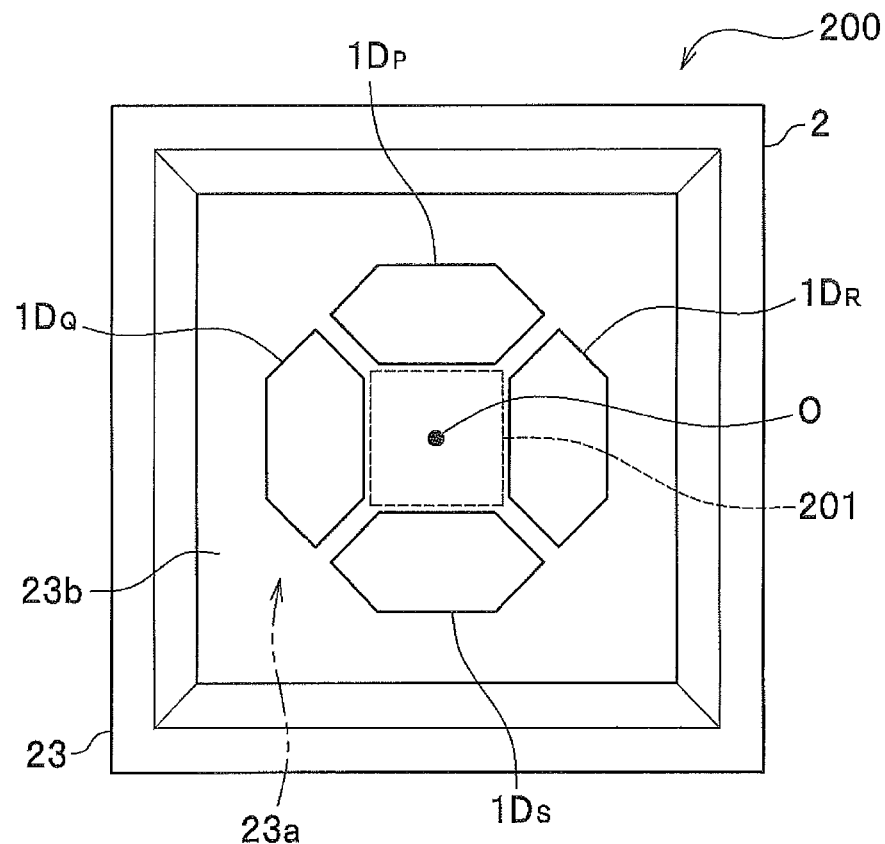
FIG. 11A is a schematic plan view showing the configuration of a light emitting device according to a second embodiment.

FIG. 11A is a schematic plan view showing the configuration of the light emitting device according to the second embodiment. FIG. 11B is a schematic plan view showing the configuration of a light emitting element in the light emitting device according to the second embodiment.

Note that, similarly to FIGS. 8A to 10F, FIG. 11A shows the configuration of the light emitting device in a simplified manner. Further, in FIG. 11B, the configuration of the light emitting element shows the outer shape in a plan view and respective external connection portions of the n-side electrode 13 and the p-side electrode 14. Still further, the vertexes of the hexagon that is the outer shape of the light emitting element is indicated by A to F for the sake of convenience. The same holds true for FIGS. 12A and 12B referred to later.

Configuration of Light Emitting Device

In a light emitting device 200 according to the second embodiment, on the bottom surface 23b of the recess 23a of the package 2, four light emitting elements 1D ($1D_P$, $1D_Q$, $1D_R$, $1D_S$) each having an outer shape of an elongated hexagon in a plan view are arranged two-dimensionally, about an approximately quadrangular (approximately square) gap 201.

Note that, the package 2 is similar to that in the first embodiment. Further, the light emitting element 1D has a similar configuration as that of the light emitting element 1 according to the first embodiment, except for the outer shape in a plan view. Accordingly, the detailed description on the configuration and the method of manufacturing will be omitted.

The interior angles of vertexes A, D of the elongated hexagon of the outer shape of the light emitting element 1D are a same angle of equal to or less than 90°, and 90° is preferable. Further, the interior angles of other vertexes B, C, E, F are a same angle of equal to or greater than 135°, and 135° is preferable. Still further, the light emitting element 1D has an elongated outer shape in a plan view, in which a diagonal line AD is in the long-length direction, and the direction normal from a point on a side CB to a side EF is the short-length direction. Sides AB, CD, DE, FA have a same length. Further, the sides BC and EF have a same length that is preferably longer than the other sides. Still further, preferably, respective external connection portions of the n-side electrode 13 and the p-side electrode 14 are respectively provided near one end and other end in the long-length direction.

In the present embodiment, a description will be given of the case where the interior angle of each of the vertexes A, D is 90°, the interior angle of each of the vertexes B, C, E, and F is 135°, and the sides BC and EF are identical to diagonal lines BF and CE in length. Accordingly, the sides BC and EF are the long sides longer than the other sides, and the other sides are the short sides.

In connection with the light emitting device 200, the bottom surface 23b of the recess 23a being approximately square in a plan view is the region for disposing the light emitting elements 1D, and the center of the disposition region in a plan view is O. The four light emitting elements 1D are disposed having respective one long sides oriented toward the center O. Therefore, the four light emitting elements 1D are disposed so as to form the approximately square gap 201 at the center O about which the light emitting elements 1D are disposed.

Note that, the center of the four light emitting elements 1D not necessarily agree with the center O of the disposition region, and the center may be at different position than the center O.

Further, it can be regarded that the four light emitting elements 1D are disposed in a staggered arrangement two dimensionally. The light emitting elements $1D_P$, $1D_S$ in odd rows (the first and third rows) are disposed such that the long-length direction becomes parallel to the lateral direction in a plan view, and the light emitting elements $1D_Q$, $1D_R$ in an even row (the second row) are disposed such that the long-length direction becomes parallel to the longitudinal direction in a plan view. In other words, the light emitting elements $1D_P$, $1D_S$ in the odd rows and the light emitting elements $1D_Q$, $1D_R$ in the even row are rotated by 90° relative to each other about an axis perpendicular to the upper surface.

The four light emitting elements 1D are disposed such that their respective short sides of the elongated hexagons being the outer shape in a plan view oppose to each other in parallel. Further, though their respective long sides of the elongated hexagons oppose to each other in parallel, they oppose to each other relatively spaced apart via the gap 201. Accordingly, a great amount of light is input from the lateral side surfaces of the light emitting elements 1D at only two short sides per light emitting element 1D.

Therefore, even when a plurality of light emitting elements 1D are densely disposed in close proximity to each other, the amount of light input from the lateral side surfaces of the light emitting elements 1D is limited. Hence, the light extraction efficiency can be improved.

Note that, the light emitting device 200 is different from the light emitting device 100 according to the first embodiment in just the outer shape of the light emitting elements, the number of disposed light emitting elements and the disposition position of the light emitting elements. Therefore, the detailed description of the manufacturing method will be omitted.

Simulation of Luminous Flux of Light Emitting Device

Next, with reference to FIGS. 12A to 13, a description will be given of the simulation of the luminous flux of the output light obtained when the distance between respective short sides of the light emitting elements 1D opposing to each other in parallel in the light emitting device 200 is varied.

Figure 12A:
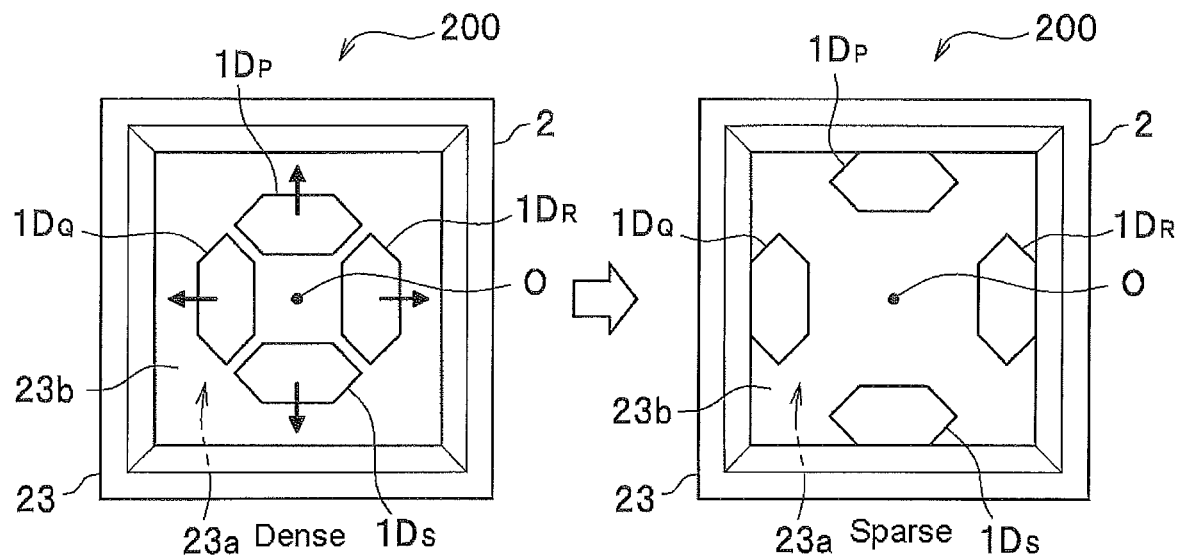
FIG. 12A is a schematic plan view for describing disposition of light emitting elements used in simulating the luminous flux of the light emitting device according to the second embodiment.
Figure 12B:
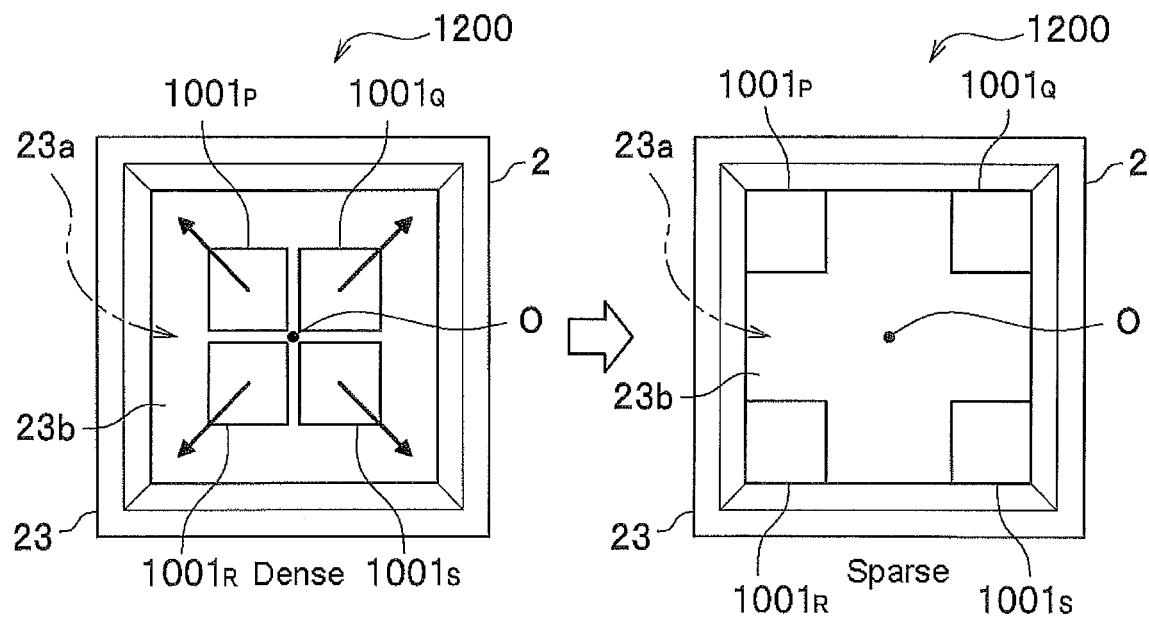
FIG. 12B is a schematic plan view for describing disposition of light emitting elements in simulating the luminous flux of the light emitting device according to Comparative Example.

FIG. 12A is a schematic plan view for describing the disposition of light emitting elements used in simulating the luminous flux of the light emitting device according to the second embodiment. FIG. 12B is a schematic plan view for describing disposition of light emitting elements used in simulating the luminous flux of a light emitting device according to Comparative Example. FIG. 13 is a graph showing the simulation results of the luminous flux of the light emitting device according to the second embodiment and the light emitting device according to comparative example.

Simulation Condition

A description will be given of the shape of the model of the light emitting device 200 used in simulating the luminous flux.

Figure 11B:
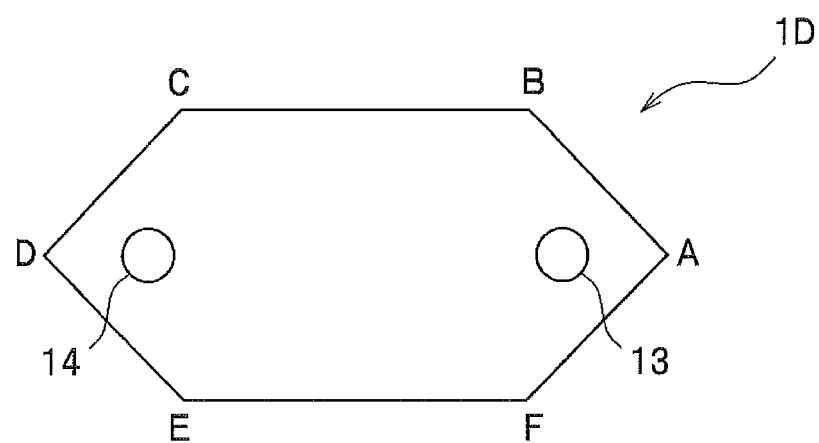
FIG. 11B is a schematic plan view showing the configuration of a light emitting element in the light emitting device according to the second embodiment.

The light emitting element 1D has an outer shape of an elongated hexagon in a plan view shown in FIG. 11B. The interior angles of vertexes A, D are each 90°, and the interior angles of the vertexes B, C, E, F are each 135°. The sides BC and EF being the long sides each have a length of 500 μm; the distance between the sides BC and EF is 500 μm; and the light emitting elements 1D each have a thickness of 150 μm. Accordingly, the outer-shape area of the light emitting element 1D in a plan view is 375000 μm². Further, the light emission area obtained by subtracting the area of the step portion from which the p-type semiconductor layer 12p and the active layer 12a are removed for providing the n-side electrode 13 is 345450 μm².

The recess 23a of the package 2 is opened in a square shape of which one side has a length of 2600 μm. The bottom surface 23b of the recess 23a forms a square of which one side has a length of 2240 μm. Accordingly, the lateral side surfaces of the recess 23a are linearly inclined widening upward in a cross-sectional view.

As Comparative Example, the luminous flux was simulated also with a light emitting device 1200 in which light emitting elements 1001 having the outer-shape area, the light emission area and the thickness identical to those of the light emitting element 1D, and each having a square outer shape were mounted. Note that, the approximately square outer shape of each light emitting element 1001 has a side of 612.38 μm.

Further, in connection with the light emitting device 200, the four light emitting elements 1D are disposed such that respective short sides of the elongated hexagons being the outer shape in a plan view oppose to each other in parallel, and such that the center of the four light emitting elements 1D agrees with the center O of the bottom surface 23b of the recess 23a. Further, the light emitting elements $1D_P$, $1D_S$ are disposed such that the long sides of the outer shape become parallel to one side of the square being the shape of the bottom surface 23b, and the light emitting elements $1D_Q$, $1D_R$ are disposed such that the long sides of the outer shape become perpendicular to the long sides of the outer shape of the light emitting elements $1D_P$, $1D_S$.

Still further, the luminous flux was simulated while gradually varying the distance between respective short sides of the light emitting elements 1D opposing to each other in parallel from the state where the light emitting elements 1D are substantially closely attached to each other (the state indicated as "dense" in FIG. 12A) to the state where the outer long sides are substantially in contact with the sides of the bottom surface 23b (the state indicated as "sparse" in FIG. 12A).

Note that, the distance between the short sides is 7.05 μm in the "dense" state, and 493.5 μm in the "sparse" state.

Further, in connection with the light emitting device 1200 of Comparative Example, the four light emitting elements 1001 are square arrayed in two rows and two columns. At this time, the four light emitting elements 1001 are disposed such that their center agrees with the center O of the bottom surface of the recess 23a. Further, the four light emitting elements 1001 are arranged such that the squares being the outer shape of the light emitting elements 1001 are oriented similarly to the square being the shape of the bottom surface 23b. Accordingly, the light emitting elements 1001 are disposed such that respective one sides of the squares being the outer shape of the light emitting elements 1001 being adjacent to each other in the longitudinal and lateral directions in a plan view oppose to each other in parallel.

Further, the luminous flux was simulated while gradually varying the distance between respective sides of the squares of the light emitting elements 1001 opposing to each other in parallel from the state where the light emitting element 1001 are substantially closely attached to each other (the state indicated by "dense" in FIG. 12B) to the state where the outer long sides are substantially in contact with the sides of the bottom surface 23b (the state indicated as "sparse" in FIG. 12B).

Note that, the distance between the sides opposing in parallel is 7.62 μm in the "dense" state, and 987.62 μm in the "sparse" state.

Simulation Result

For reference, simulation was conducted as to the luminous flux of a light emitting device in which one light emitting element 1D or one light emitting element 1001 is mounted substantially at the center of the bottom surface 23b of the package 2. As a result, when the luminous flux of the light emitting device in which one light emitting element 1001 having a square outer shape was mounted was 100%, the luminous flux of the light emitting device in which one light emitting element 1D having an elongated hexagonal outer shape was mounted was 99.6%. It was found that, in the cases where one light emitting element was mounted, though the luminous flux was slightly greater with the light emitting element having a square outer shape, they were substantially the same.

Figure 13:
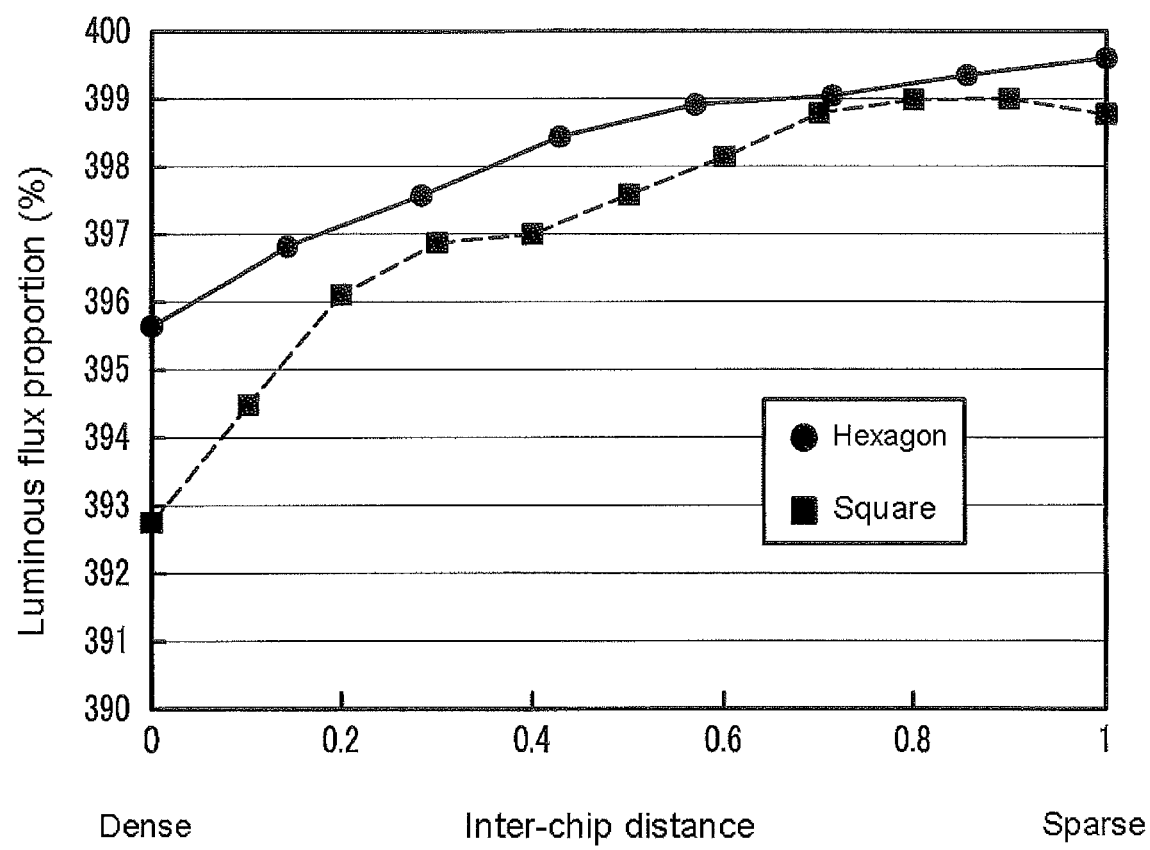
FIG. 13 is a graph showing the simulation results of the luminous flux of the light emitting device according to the second embodiment and the light emitting device according to Comparative Example.

Further, FIG. 13 shows the simulation results as to the cases where the four light emitting elements were mounted and the interval between the light emitting elements were varied. In FIG. 13, the vertical axis represents the luminous flux proportion of the light emitting device 200 (plotted by filled circles) and the light emitting device 1200 (plotted by filled squares) where the luminous flux of light emitting devices in each of which one light emitting element of the corresponding outer shape is mounted is 100%. Further, the inter-chip distance on the horizontal axis represents the distance between respective sides of the light emitting elements opposing to each other in parallel. On the horizontal axis, the "dense" state is "0" and the "sparse" state is "1".

In both the light emitting device 200 and the light emitting device 1200, as the inter-chip distance becomes greater, the luminous flux proportion increases. On the other hand, the light emitting device 200 is greater than in the luminous flux proportion than the light emitting device 1200 at every inter-chip distance. In particular, when the light emitting elements are disposed in the "dense" state, the light emitting device 200 prominently shows the higher values.

In the light emitting device 1200, two sides of a square being the outer shape of one light emitting element 1001 oppose in parallel to other adjacent light emitting elements 1001. On the other hand, in the light emitting device 200, only two short sides of a hexagon being the outer shape of one light emitting element 1D oppose in parallel in close proximity to other light emitting elements 1D. Though one long side of one light emitting element 1D oppose in parallel to one long side of other light emitting element 1D, these long sides are spaced apart from each other at least by the length of themselves. Therefore, the amount of light entering from the side surfaces corresponding to the long sides reduces. Accordingly, as the inter-chip distance is smaller, that is, when the light emitting elements are disposed denser, the luminous flux extracted to the outside becomes greater with the light emitting device 200 than with the light emitting device 1200.

Further, with the light emitting device 1200, when the inter-chip distance is "sparse", the luminous flux proportion slightly reduces. This is because that, when the light emitting elements 1001 each having a square outer shape are disposed excessively near to the lateral side surfaces of the recess 23a of the package 2, a greater amount of light reflected from the lateral side surfaces of the recess 23a enters from the lateral side surfaces of the light emitting element 1001. With the light emitting device 200, even when the light emitting elements 1D are disposed in close proximity to the lateral side surfaces of the recess 23a, only one long side of a hexagon being the outer shape in a plan view oppose in parallel to one side of a square corresponding to the lateral side surfaces of the recess 23a, and the short sides do not oppose in parallel to the sides of the square. Therefore, the amount of light reflected from the lateral side surfaces of the recess 23a and enters from the side surfaces of the light emitting elements 1D reduces. Accordingly, even when the light emitting elements 1D are disposed so close to the lateral side surfaces of the recess 23a that they are brought into contact, the luminous flux from the light emitting device 200 does not reduce.

Therefore, it can be seen that, with the light emitting device 200, a higher luminous flux proportion can be obtained even when the light emitting elements are arranged in close proximity to the lateral side surfaces of the recess 23a. In other words, even when the area of the bottom surface 23b of the recess 23a being the region where the light emitting elements 1D are mounted is reduced, the luminous flux of the light emitting device 200 does not reduce.

Accordingly, the disposition where the light emitting elements 1D having a hexagonal outer shape are disposed having their respective short sides opposed to each other in parallel having the approximately square gap 201 interposed therebetween at the center is the configuration suitable for miniaturizing the package 2, or increasing the output by mounting a plurality of light emitting elements 1D.

Third Embodiment

Figure 14:
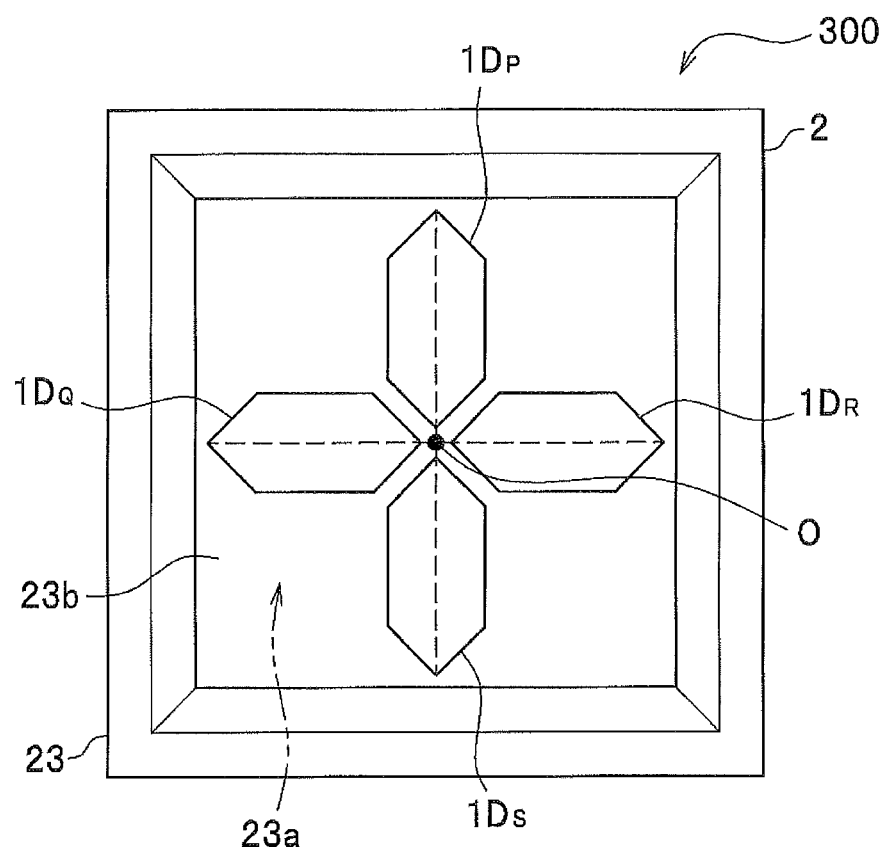
FIG. 14 is a schematic plan view showing the configuration of a light emitting device according to a third embodiment.

Next, with reference to FIG. 14, a description will be given of a light emitting device according to a third embodiment. FIG. 14 is a schematic plan view showing the configuration of the light emitting device according to the third embodiment.

Note that, since the light emitting element 1D and the package 2 are similar to those in the second embodiment, the detailed description of the configuration of each member will be omitted.

In a light emitting device 300 according to the third embodiment, on the bottom surface 23b of the recess 23a of the package 2, four light emitting elements 1D (1D$_P$, 1D$_Q$, 1D$_R$, 1D$_S$) each having an elongated hexagonal outer shape in a plan view are disposed in a cross shape.

More specifically, in the light emitting device 300, the four light emitting elements 1D are disposed each having one of the vertexes formed between short sides and of which interior angle is 90° oriented toward the center O. Further, the four light emitting elements 1D are disposed such that the long-length direction of two light emitting elements 1D$_P$, 1D$_S$ becomes parallel to the longitudinal direction and the long-length direction of the other two light emitting elements 1D$_Q$, 1D$_R$ becomes parallel to the lateral direction.

Note that, the center position to which the vertexes of the four light emitting elements 1D are oriented does not necessarily agree with the center O of the disposition region, and may be displaced from the center O.

Here, the light emitting elements 1D are disposed such that the two short sides forming the 90° interior angle of one light emitting element 1D oppose in parallel to the two short sides forming the 90° interior angle of other light emitting element 1D in a plan view. Further, two long sides of one light emitting element 1D do not oppose to any sides of other light emitting elements 1D in a plan view. Further, though the long sides oppose in parallel to the sides of the square being the shape of the recess 23a, they are spaced apart from the sides of the square by at least 1.5 times as long as the length of the long sides. Further, in a plan view, other short sides of one light emitting element 1D do not oppose in parallel to any sides of other light emitting elements 1D, or to the sides of the square being the shape of the recess 23a. Accordingly, since the amount of the output light from the side surfaces of the light emitting element 1D and the reflection light from the lateral side surfaces of the recess 23a entering from the side surfaces of the light emitting element 1D reduces, the output of the light emitting device 300 can be increased.

Further, it can be regarded that the four light emitting elements 1D are disposed in a staggered arrangement two dimensionally. The light emitting element 1D$_P$, 1D$_S$ in odd rows (the first and third rows) are disposed such that the long-length direction becomes parallel to the longitudinal direction in a plan view, and the light emitting elements 1D$_Q$, 1D$_R$ in an even row (the second row) is disposed such that the long-length direction becomes parallel to the lateral direction in a plan view. In other words, the light emitting elements 1D$_P$, 1D$_S$ in the odd rows and the light emitting elements 1D$_Q$, 1D$_R$ in the even row are rotated by 90° relative to each other about an axis perpendicular to the upper surface.

Note that, the interior angle and the length of the side of the light emitting element 1D can be determined similarly to the light emitting element 1D according to the second embodiment. Accordingly, each interior angle formed between short sides is preferably 90°, but may be 90° or less. Other interior angles may each preferably be 135°, but may be 135° or more.

Further, since the light emitting device 300 is different from the light emitting device 200 according to the second embodiment only in the orientation of the light emitting elements 1D. Therefore, the detailed description as to the manufacturing method will be omitted.

In the foregoing, while the light emitting device according to the embodiments of the present invention has been specifically described based on the embodiments, the spirit of the present invention is not limited by such description, and should be construed broadly based on the scope of claims. Further, it goes without saying that various changes and modifications based on such description are also included in the spirit of the present invention.

The light emitting device according to the embodiments of the present disclosure can be used for various light sources, such as a backlight light source of a liquid crystal display, various illumination devices, a large-size display, various display apparatuses such as an advertisement or a destination guide, and furthermore, an image reading apparatus in a digital video camera, a facsimile, a copier, a scanner and the like, and a projector apparatus.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
   a package having a contiguous recess with a bottom surface and a height direction perpendicular to the bottom surface, the package having a first lead and a second lead;
   a plurality of light emitting elements disposed on the bottom surface, each of the plurality of light emitting elements having a hexagonal shape with six corners viewed in the height direction, an interior angle at each of the corners being less than 180°, the plurality of light emitting elements comprising:
      a first light emitting element comprising:
         a first electrode having a first external connection portion and provided at a first corner of the first light emitting element; and
         a second electrode having a second external connection portion, the first external connection portion and the second external connection portion both being provided along a line extending from a first corner of the hexagonal shape of the first light emitting element to an opposite second corner of the hexagonal shape of the first light emitting element; and
      a second light emitting element comprising:
         a third electrode; and
         a fourth electrode; and
   a first wire directly connecting the first electrode and the third electrode, a part of the first wire being apart from the first light emitting element and the second light emitting element,
   wherein the third electrode has a third external connection portion and is provided at a first corner of the second light emitting element,
   wherein the fourth electrode has a fourth external connection portion, the third external connection portion and the fourth external connection portion both being provided along a line extending from a first corner of the hexagonal shape of the second light emitting element to an opposite second corner of the hexagonal shape of the second light emitting element,
   wherein the first light emitting element and the second light emitting element are arranged such that the line extending from the first corner of the first light emitting element to the opposite second corner of the first light emitting element is aligned with the line extending from the first corner of the second light emitting element to the opposite second corner of the second light emitting element,
   wherein the first light emitting element and the second light emitting element are provided on the first lead,
   wherein the second electrode is electrically connected to the second lead via a second wire, and
   wherein the fourth electrode is electrically connected to the first lead via a third wire,
   the light emitting elements disposed in an even row are rotated by 90° about an axis perpendicular to the upper surface of the package relative to the light emitting elements arranged in an odd row.

2. The light emitting device according to claim 1, wherein the light emitting elements are bonded to the package using silicone-base die bonding resin.

3. The light emitting device according to claim 2, further comprising a sealing resin sealing the light emitting elements, wherein an index of refraction of the die bonding resin is equal to or smaller than an index of refraction of the sealing resin.

4. The light emitting device according to claim 1, wherein the first light emitting element and the second light emitting element are provided such that the first corner of the first light emitting element is closer to the second light emitting element than the other corners of the six corners of the first light emitting element.

5. The light emitting device according to claim 1,
   wherein the package includes the first lead and the second lead and a resin part,
   wherein the first lead and the second lead are disposed on the bottom surface of the contiguous recess, and
   wherein the first light emitting element and the second light emitting element are provided on the first lead.

6. The light emitting device according to claim 1,
   wherein the first electrode is an n-side electrode and the second electrode is a p-side electrode,
   wherein the n-side electrode comprises:
      the first external connection portion; and
      a first extending portion extending from the first external connection portion toward the p-side electrode, and
   wherein the p-side electrode includes a pad electrode comprising:
      the second external connection portion; and
      a second extending portion extending from the second external connecting portion toward the first external connection portion to surround the first extending portion.

7. The light emitting device according to claim 1,
   wherein the first light emitting element and the second light emitting element are electrically connected in series.

8. The light emitting device according to claim 1,
   wherein the third electrode is a p-side electrode and the fourth electrode is an n-side electrode,
   wherein the p-side electrode includes a pad electrode comprising:
      the third external connection portion; and
      a third extending portion,
   wherein the n-side electrode comprises:
      the fourth external connection portion; and
      a fourth extending portion extending from the fourth external connection portion toward the p-side electrode, and wherein the third extending portion extends from the third external connecting portion toward the fourth external connection portion to surround the fourth extending portion.

9. The light emitting device according to claim 1, wherein the first wire is directly connected to the first external connection portion and the third external connection portion.

10. The light emitting device according to claim 1,
wherein the first external connection portion is provided closer to the first corner than the other corners of the six corners of the first light emitting element,
wherein the third external connection portion is provided closer to the first corner of the second light emitting element than the other corners of the six corners of the second light emitting element, and
wherein the first corner of the first light emitting element is provided closer to the first corner of the second light emitting element than to the other corners of the six corners of the second light emitting element.

11. The light emitting device according to claim 1, wherein the second light emitting element is closest to the first light emitting element among the plurality of light emitting elements.

\* \* \* \* \*